United States Patent
Smith et al.

(10) Patent No.: US 7,719,329 B1
(45) Date of Patent: May 18, 2010

(54) PHASE-LOCKED LOOP FAST LOCK CIRCUIT AND METHOD

(75) Inventors: Keith N. Smith, Silversprings (IE);
Eugene F. O'Sullivan, Beara (IE);
David P. Keating, Douglas (IE)

(73) Assignee: Cypress Semiconductor Corporation, San Jose, CA (US)

( * ) Notice: Subject to any disclaimer, the term of this patent is extended or adjusted under 35 U.S.C. 154(b) by 151 days.

(21) Appl. No.: 11/818,740

(22) Filed: Jun. 15, 2007

(51) Int. Cl.
*H03L 7/06* (2006.01)

(52) U.S. Cl. .................... 327/157; 327/156; 327/39

(58) Field of Classification Search ............ 327/148, 327/155, 156, 157, 160, 147, 39, 40, 42, 327/47; 333/1; 375/373–376
See application file for complete search history.

(56) References Cited

U.S. PATENT DOCUMENTS

| | | | |
|---|---|---|---|
| 4,075,569 A | 2/1978 | Wright | |
| 4,617,678 A | 10/1986 | Devensky et al. | |
| 4,787,097 A | 11/1988 | Rizzo | |
| 6,088,331 A | 7/2000 | Beshai et al. | |
| 7,061,330 B2 * | 6/2006 | Kegasa et al. | 331/11 |
| 7,151,413 B2 * | 12/2006 | Lin | 331/11 |
| 7,439,816 B1 * | 10/2008 | Lombaard | 331/16 |
| 7,443,206 B1 * | 10/2008 | Fernandez | 327/12 |
| 7,443,761 B2 * | 10/2008 | Lin | 327/156 |
| 7,538,591 B2 * | 5/2009 | Oh | 327/156 |
| 2001/0015677 A1 * | 8/2001 | Choi | 331/11 |
| 2006/0158274 A1 * | 7/2006 | Self | 331/107 SL |

OTHER PUBLICATIONS

USPTO Notice of Allowance for U.S. Appl. No. 11/541,025 dated Jun. 13, 2008; 6 pages.
USPTO Non-Final Rejection for U.S. Appl. No. 11/541,025 dated Jan. 22, 2008; 6 pages.
Fouzar at al.. "Very Short Looking Time PLL Based on Controlled Gain Technique," ICECS 2000—IEEE International Conference on Electronics, Circuits and Systems, Dec. 2000, vol. 1, pp. 252-256; 4 pages.
Fouzer et al., "A New Fully Integrated CMOS Phase-Locked Loop with Low Jitter and Fast Lock Time," ISCAS 2000—IEEE International Conference on Electronics, Circuits and Systems, May 2000, vol. 2, pp. 253-250; 4 pages.
"Phase-Locked Loop," <http://en.wikipedia.org/wiki/Phase-locked_loop>, May 29, 2006; 10 pages.

(Continued)

*Primary Examiner*—Long Nguyen
*Assistant Examiner*—Sibin Chen

(57) ABSTRACT

Phase-locked loop (PLL) fast lock circuit and method using a second frequency controlled feedback loop to complement a primary frequency and phase controlled feedback loop. The second loop may charge a capacitor controlling input voltage to a voltage controlled oscillator (VCO) up and down faster that the primary loop, such as using up and a down charge pumps. In some cases, the second loop uses a frequency detector to detect a difference between a reference and feedback signal frequencies; and in response uses logic to control two pump up and two pump down charge pumps. The frequency detector may be configured to receive a reset signal and a lock signal. The reset signal causes the second loop to send a strong pump up charge to the capacitor without waiting for a difference in the frequencies. The lock signal causes the frequency detector to stops counting the difference in the frequencies.

17 Claims, 18 Drawing Sheets

OTHER PUBLICATIONS

"1.8V, 500-MHz, 10-Output JEDEC-Compliant Zero Delay Buffer," Cypress Advanced information, Feb. 2, 2004; 9 pages.
USPTO Non-Final Rejection for U.S. Appl. No. 11/541,000 dated Sep. 28, 2009; 7 pages.
USPTO Requirement for Restriction/Election for U.S. Appl. No. 11/641,000 dated Jun. 24, 2009; 5 pages.

* cited by examiner

PHASE-LOCKED LOOP FAST LOCK CIRCUIT AND METHOD

TECHNICAL FIELD

Embodiments of the present invention relate to phase-locked loop circuits and, more particularly, to phase-locked loop circuits with fast lock capabilities.

BACKGROUND

Phase-Locked Loop (PLL) circuits are widely used in computer and data communication systems. For example, in one common application, a PLL circuit generates a common clocking signal for distribution to several system components. The common clocking signal ensures system synchronization for reduced system errors and improved efficiency. Such circuits are commonly called Zero Delay Buffer (ZDB) circuits.

Another common application for PLL circuits is data communications. For example, a data signal demodulator uses a PLL to recover clock and data signals transmitted through a transmission line or wireless medium. The PLL in a transmission system typically cleans noise and jitter from the data and clock signals, and facilitates synchronization of the internal clocks of the transmit and receive systems.

One common problem facing designers of PLL circuits is the amount of time that it takes to synchronize or lock a feedback (FB) signal with a reference (REF) signal. For example, certain communication systems may require synchronization of clock signals within a few milliseconds. Similarly, certain computer systems may require production of a clean version of a clock signal for distribution within a few cycles of the clock signal. As technology advances, processing speeds and data rates increase. These increases in system speed are driving clock frequencies higher and higher. Systems requiring clock signal synchronization within a few cycles require very responsive and precisely configured PLL circuits. In recent years, standard PLL circuit designs have not met the synchronization time requirements of some new systems.

FIG. 1 is a block diagram illustrating a conventional PLL circuit architecture. Such PLL circuits are commonly referred to as "charge pump PLL" circuits. A typical PLL circuit includes a phase-frequency detector (PFD), a charge pump (CP), a loop filter (illustrated by the series combination of a resistor, a capacitor, and ground), and a voltage controlled oscillator (VCO). Some common PLL circuits may also include one or more frequency dividers (e.g., a divide-by-N counter in the feedback loop), and other components, which, for convenience, are not illustrated in FIG. 1.

In the depicted example of a common PLL circuit, the phase-frequency detector receives as inputs a reference clock signal and a feedback clock signal. The phase-frequency detector detects the difference in phase and frequency between the reference clock signal and the feedback clock signal and generates an output signal based on whether the feedback clock signal is lagging or leading the reference clock signal in phase. The phase-frequency detector provides this control signal to the charge pump. In response to the control signal, the charge pump generates a current flow with respect to the components of the loop filter. The control signal determines the magnitude and direction of the current flow, which either charges or drains the capacitor in the loop filter. The loop filter converts these signals to a control voltage that sets the VCO frequency. Based on the control voltage, the VCO oscillates at a higher or lower frequency, which affects the phase and frequency of the feedback clock signal. When the phases of the reference clock signal and the feedback clock signal are synchronized, the PLL is considered locked (i.e., phase locked).

One drawback of the PLL circuit illustrated in FIG. 1 is that the phase-frequency detector and charge pump do not efficiently charge the capacitor in the loop filter. For example, an "up" signal is sometimes cancelled by a "down" signal when only an up signal should have been applied. This reduces the net current flow and, hence, the efficiency of the PLL circuit. Thus, some inefficiency exists. Further, to avoid overshoot and to promote stability, the phase-frequency detector and charge pump may be configured to make relatively slow or subtle adjustments to the frequency and phase of the feedback clock signal. Although the control voltage controls the frequency, and as a result controls the phase, the frequency is adjusted too slowly to lock to the reference signal within certain time constraints.

FIG. 2 illustrates a conventional PLL, which includes a frequency detector (FD). Other conventional methods of reducing lock time in a PLL typically include increasing the bandwidth of the PLL, or implementing some method of frequency detection to control a programmable gain charge pump that is driven by the phase-frequency detector, as discussed, for example, in Y. Fouzar, M. Sawan, Y. Savaria, "Very short locking time PLL based on controlled gain technique", *ICECS 2000—IEEE International Conference on Electronics, Circuits and Systems,* 17-20 Dec. 2000, Volume 1, pp. 252-255.

Another conventional method of reducing lock time involves controlling the VCO control voltage using matched frequency-to-voltage converters and so-called "coarse control loop," as discussed in Y. Fouzar, M. Sawan, Y. Savaria, "A New Fully Integrated CMOS Phase-Locked Loop with Low Jitter and Fast Lock Time", *ISCAS 2000—IEEE International Symposium on Circuits and Systems,* 28-31 May 2000, Volume 2, pp. 253-256.

Another common method of reducing lock time involves constraining the VCO control voltage to some open-loop, predefined value by pre-charging the loop filter capacitor. However, such a predefined value may not match well with the voltage required for the VCO to produce the frequency as required by the input frequency. In another conventional method, a lock detector increases the charge pump current (and, hence, the PLL bandwidth) if the reference and feedback clock signals are not locked.

Each of these conventional PLL circuits have inherent drawbacks which make them inadequate for systems requiring fast lock times and a high level of stability. In the cases where the PLL bandwidth is increased, there is an added risk of instability. Moreover, the problem of phase-frequency detector inefficiency is not adequately remedied in such systems. Where a frequency-to-voltage converter and analog controller are used, the controller typically needs to be optimized for each particular VCO that is used. Additionally, the frequency-to-voltage converters typically need to be matched. Such methods are inherently inefficient, error prone, and labor intensive. Considering that the frequency-to-voltage converter covers the entire range of operation, fine adjustments to phase and frequency are difficult to make with any measure of accuracy and stability.

One of the primary problems with conventional PLL solutions is instability in the output signal. As a PLL design is adjusted to reduce the time required for synchronization, certain designs may result in frequency overshoot and oscillations.

FIG. 3 illustrates a conventional range controller type frequency detector. The range controller receives a reference clock (RefCLK). The other clock is the recovered clock (RxCLK) generated by the VCO of a Clock&Data Recovery (CDR) PLL. A counter is provided for each clock. The counters are reset together and, at a certain point in the reference clock count, the RxCLK is sampled by the RefCLK domain. The values of the counters are compared and a decision is made to determine if the status is to be updated as "locked" or "unlocked" (i.e. the RxCLK is within a given range from the RefCLK).

The "inner" and "outer" windows are logic constructs used to implement deadzone and hysteresis. Some hysteresis is provided to allow the RxCLK to settle within the acceptable range from the RefCLK frequency. The hysteresis is defined explicitly so that only "in range" and "out of range" conditions are detected. The inner window is narrower and is used for transitioning from an out-of-range state to an in-range state, and the outer window is used for transitioning from the in-range state to the out-of-range state.

One problem associated with this conventional method is that there is no output signal to indicate whether the frequency of the RxCLK is above or below the frequency of RefCLK. This precludes its use in fast lock PLL circuits as a replacement for a phase-frequency detector, because fast lock PLL circuits typically implement a frequency detector that is capable of indicating the direction of adjustment. Furthermore, in the conventional method, it is presumed that both clock signals are always present. This assumption is not always accurate, especially during system startup when the VCO is initializing. For improved performance in fast lock applications, the range controller should not assert its outputs if either clock is absent, but should still function properly when both signals become available.

BRIEF DESCRIPTION OF THE DRAWINGS

The present invention is illustrated by way of example, and not by way of limitation, in the figures of the accompanying drawings in which.

DETAILED DESCRIPTION

A fast lock phase-locked loop (PLL) circuit is described. In the following description, numerous specific details are set forth, such as examples of specific system components, circuit topologies, method operations, etc., in order to provide a thorough understanding of embodiments of the present invention. It will be apparent, nevertheless, to one skilled in the art that embodiments of present invention may be practiced without these specific details. In other instances, well known components or methods have not been described in detail but rather in a block diagram in order to avoid unnecessarily obscuring the present invention. Thus, the specific details set forth are merely exemplary. The specific details may be varied from and still be contemplated to be within the spirit and scope of the present invention.

The following detailed description includes circuits, which will be described below. Alternatively, the operations of the circuits may be performed by a combination of hardware, firmware, and software. Interconnection between circuit components or blocks may be shown as buses or as individual signal lines. Each of the buses may alternatively be one or more individual signal lines, and each of the individual signal lines may alternatively be buses.

An apparatus and method are described for a fast locking PLL using an associated frequency detector (e.g., a symmetrical range controller), logic, and charge pumps in a second feedback loop to change the voltage at a control node of a voltage control oscillator (VCO) of the PLL more quickly than a primary feedback loop of the PLL. Specifically, the primary feedback loop of the PLL may use a phase and frequency detector to continually detect (e.g., count, determine and/or compare) a phase difference and a frequency difference between a reference signal and a feedback signal (output by the VCO). The primary loop may then use a primary charge pump to continually adjust the voltage across a capacitor of a control loop coupled to the control node based on the detected phase difference and frequency difference. In addition, the secondary feedback loop may use a range controller to detect (e.g., count, determine, and/or compare) a frequency difference between the reference signal and the feedback signal. The secondary loop may then use logic and a number of up and/or down secondary charge pumps to more rapidly (than the primary loop) adjust the voltage across the capacitor based on the detected frequency difference when the frequency difference is outside of a "dead zone" range. The number of up and/or down secondary charge pumps, and magnitude of charge pumped by each secondary charge pump may be predetermined based on the reference frequency (e.g., the frequency of a reference signal, such as the frequency within an expected range), the value of the capacitor 625, and the frequency range of the VCO.

Figure 1:
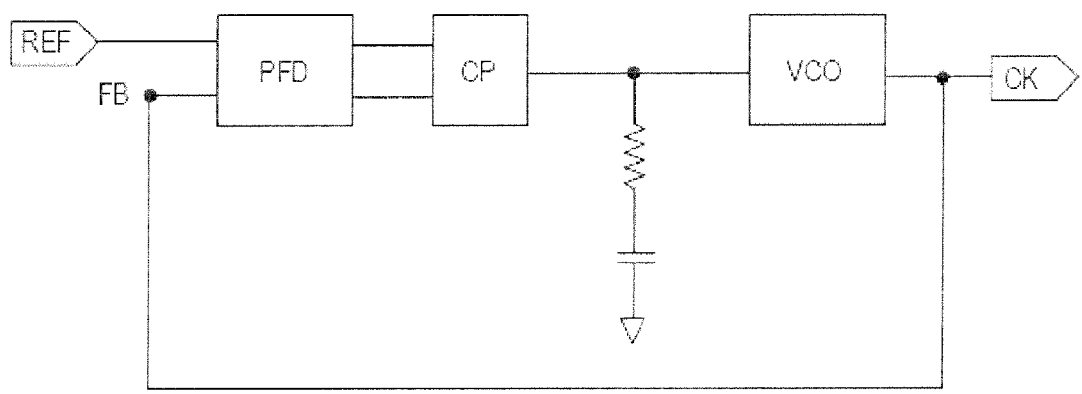
FIG. 1 illustrates a block diagram of a conventional phase-locked loop circuit.
Figure 2:
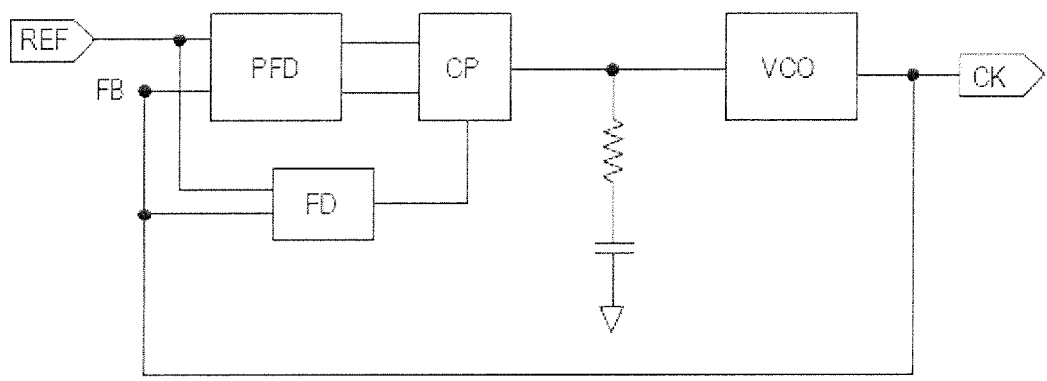
FIG. 2 illustrates a block diagram of a common improvement to a conventional phase-locked loop circuit.
Figure 3:
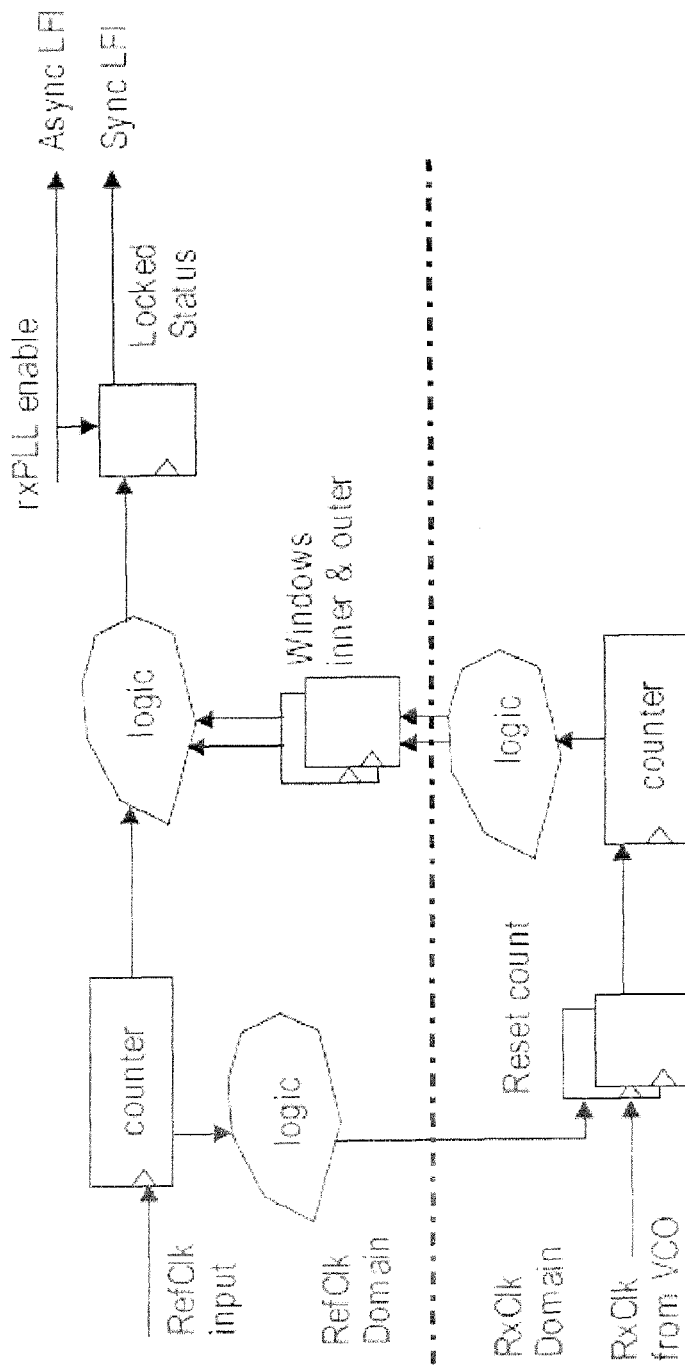
FIG. 3 illustrates a block diagram of a conventional frequency detector.
Figure 4:
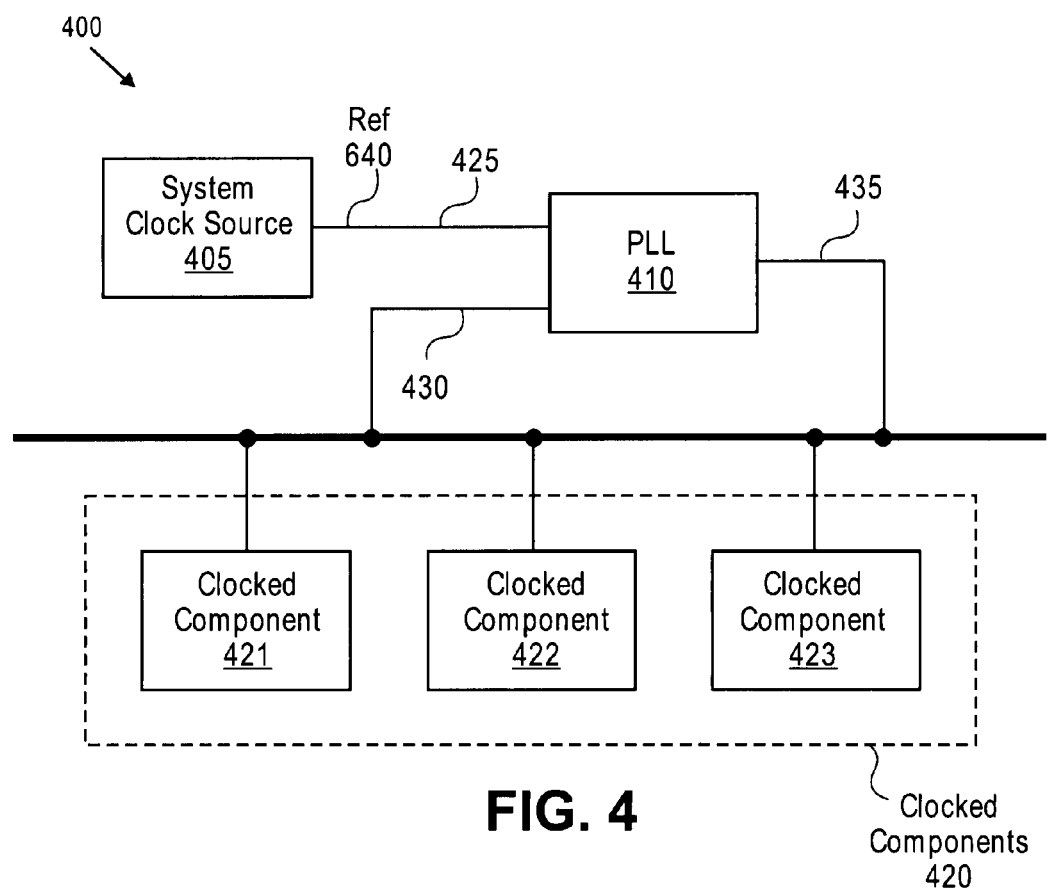
FIG. 4 illustrates a block diagram of one embodiment of a Zero-Delay Buffer clock distribution system.
Figure 5:
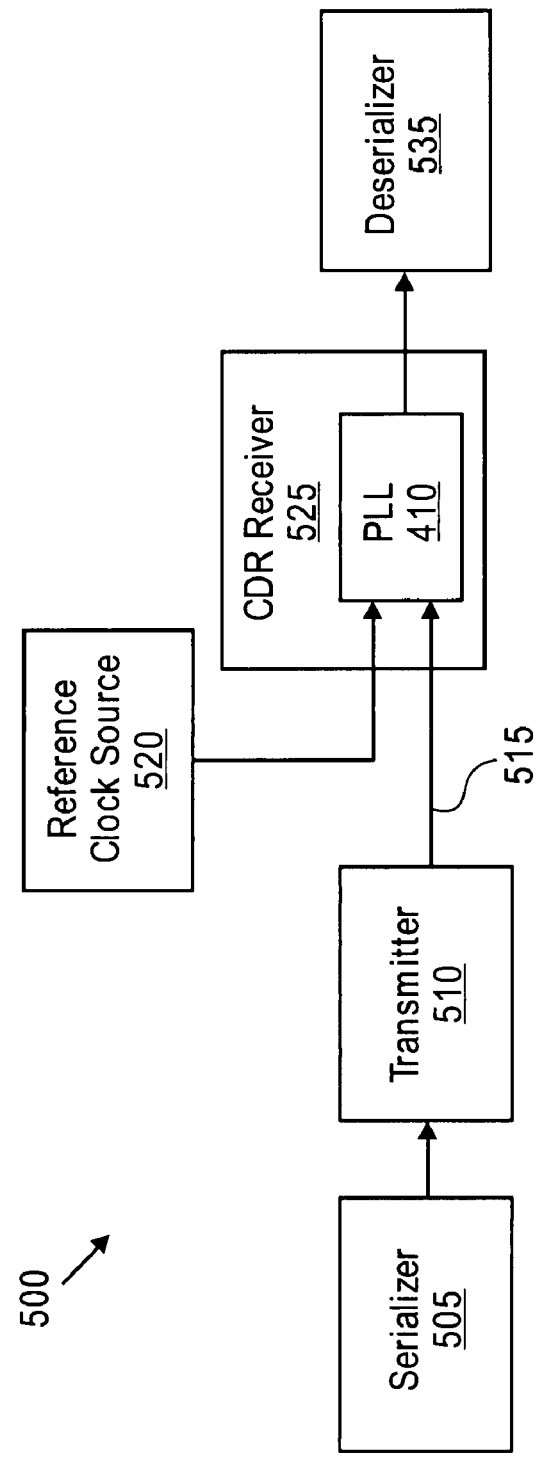
FIG. 5 illustrates a block diagram of one embodiment of a Clock Data Recovery system.

Various systems may implement fast-lock PLL circuits. A fast-lock PLL may reduce signal locking times from 3.0-3.5 μsec to 0.5-1.0 μsec. FIGS. 4 and 5 illustrate two exemplary systems that may implement a fast-lock PLL apparatus and method.

FIG. 4 illustrates a block diagram of one embodiment of a Zero-Delay Buffer (ZDB) clock distribution system 400. In one embodiment, the ZDB clock distribution system 400 implements a fast lock PLL 410. The depicted ZDB clock distribution system 400 also includes a system clock source 405, a PLL circuit 410, a clock distribution bus 415, and one or more clocked components 420 which use a buffered clock signal from the PLL 410. The PLL 410 may receive a reference signal 640 on a reference signal line 425 from the system clock source 405 and a feedback signal 645 on a feedback signal line 430. In one embodiment, the feedback signal line 430 is coupled to an output signal line 435 via the clock distribution bus 415.

The system clock source 405 provides a reference signal 640 to the PLL 410 on the reference signal line 425. In such an embodiment, the reference signal 640 provided by the system clock source 405 has a substantially constant frequency and phase. For example, the system clock source 405 may include a quartz crystal. In an alternative embodiment, the system clock source 405 may include an output signal of a PLL circuit in another component of a computer or communication system. For example, the system clock source 405 may include an external clock reference generator.

The ZDB clock distribution system 400 also includes a PLL circuit 410. The PLL circuit 410 may regenerate and sustain a stable version of the reference signal 640 that is suitable for clocking clocked components 420. In certain embodiments, the PLL 410 may multiply the reference signal 640. Additionally, the PLL 410 may remove noise from the reference signal 640. Various embodiments of the PLL circuit 410 are described in greater detail with reference to Figures below. In some embodiments, the clocked components 420 may require high-speed synchronization of the output signal from the PLL 410 and the reference signal 640 from the system clock source 405. For example, a Random Access Memory (RAM) system may require high-speed generation and distribution of a clock signal when operated at high frequencies.

The ZDB clock distribution system 400 may additionally include one or more clocked components 420 requiring a clock signal to be distributed from the PLL 410. For example, certain processors, communications devices, disk drives, RAM, and other devices may include clocked components 420 requiring a common synchronized clock signal from a PLL 410. Such clocked components 420 may operate in unison based on the common clock signal. In one embodiment, the output signal line 435 from the PLL 410 may connect to the clock distribution bus 415. The clock distribution bus 415 may distribute the clock signal to one or more clocked components 420. In an alternative embodiment, signal lines coupled to one or more signal buffers or dividers in a clock distribution tree may distribute the clock signal.

FIG. 5 illustrates a block diagram of one embodiment of a clock and data recovery (CDR) system 500. The CDR system 500 may include a data serializer 505 and a transmitter 510 on a transmit side of a data communication link 515, and a CDR receiver 525 and a data deserializer 535 on a receive side of the data communication link 515. In one embodiment, the CDR receiver 525 may include a PLL 410. The reference clock source 520 may provide a reference clock signal to the PLL 410.

The serializer 505 may collect data on a parallel data bus and convert it into a serial data stream for transmission by the transmitter 510 on the data link 515. In one embodiment, the serializer 505 may include a buffer for collecting data from the parallel lines, a multiplexer, a pattern generator, a PLL circuit, and a filter. In certain embodiments, the serializer 505 may include a fast lock PLL such as the PLL 410 in the CDR receiver 525. The serializer 505 may then pass the serialized data to a transmitter 510 which may transmit the data on the data link 515. Exemplary transmitters 510 include an antenna for wireless links, a Radio Frequency (RF) driver for coaxial transmission lines, a dual tone signal generator such as a transformer used in Digital Subscriber Lines (DSL), and the like.

Likewise, the CDR receiver 525 may include a receiving antenna, cable receiver, DSL receiver, or another type of receiver. In one embodiment, the CDR receiver 525 includes a PLL 410. The PLL 410 may recover a clock signal embedded in the signal transmitted by the transmitter 510 over the data link 515, and may use the reference clock source 520 to establish the approximate clock frequency in order to synchronize to the clock signal embedded in the transmitted signal. In certain embodiments, the PLL 410 may include a fast lock PLL circuit such as the circuits described in greater detail with reference to Figures below.

In a further embodiment, the clock and data signals recovered by the CDR receiver 525 may be placed on a receiving parallel data bus by the deserializer 535. The deserializer 535 may include similar components to those described in relation to the serializer 505. For example, the deserializer 535 may include another fast lock PLL 410.

Figure 6:
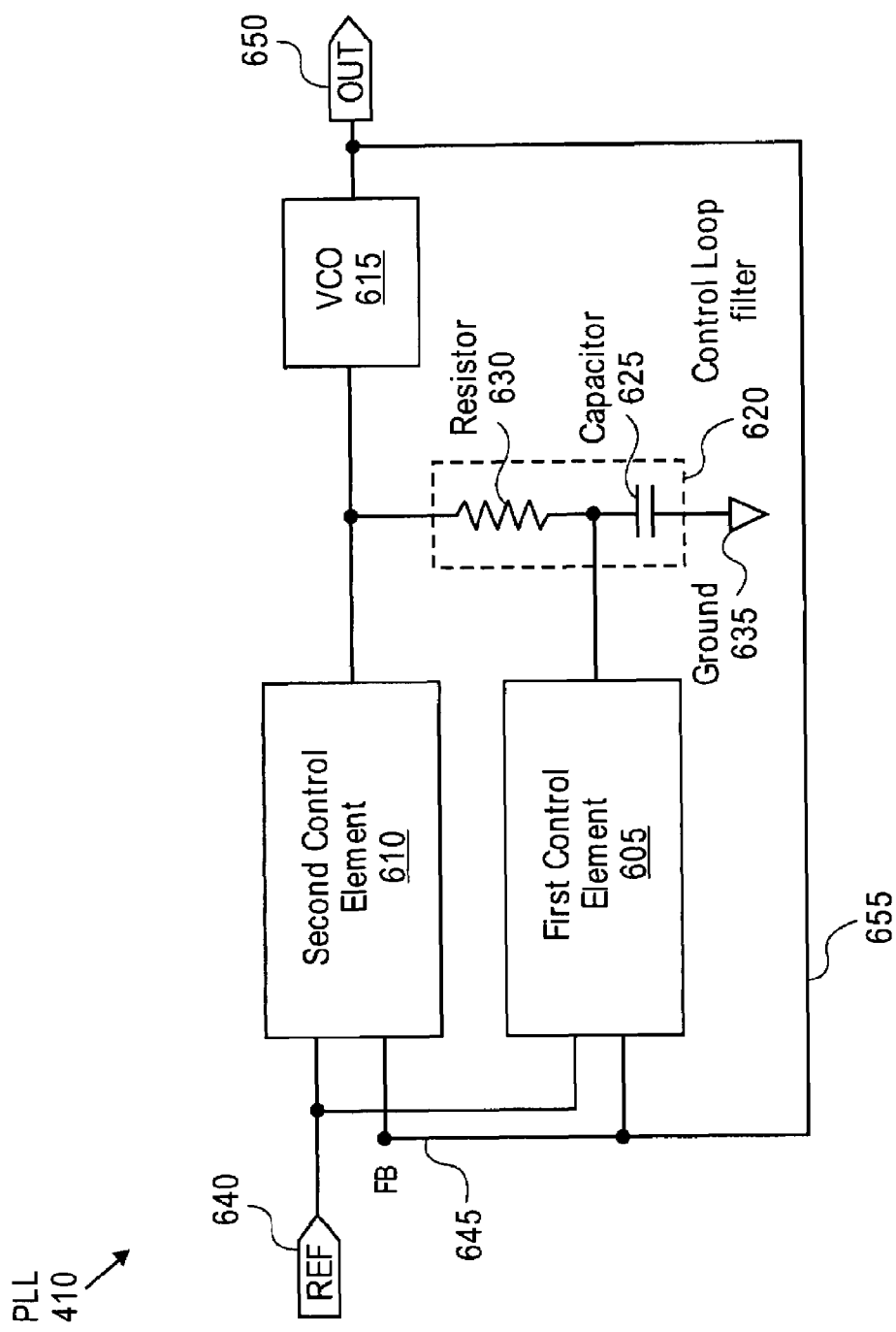
FIG. 6 illustrates a block diagram of one embodiment of a fast lock PLL circuit.

FIG. 6 illustrates a block diagram of one embodiment of a fast lock PLL circuit 410. In one embodiment, the PLL 410 includes a first control element 605 and a second control element 610 for controlling the voltage at a control node (N1) of a VCO 615. The illustrated PLL 410 also includes a control loop filter 620. The PLL 410 also includes a reference signal line 640 to receive a reference signal 640 and a feedback signal line 645 to receive a feedback signal 645. Additionally, the PLL 410 includes an output (OUT) line 650, such as an output clock line for transmitting an output clock signal. For convenience, reference to the reference signal line 640, the feedback signal line 645, and the output line 650 may refer to the physical communication medium (e.g., wires) or to a signal on the corresponding line, unless indicated otherwise. In some embodiments, the feedback signal line 645 may be coupled to the output line 650 by a feedback loop 655. For example, a signal received or input at line 645 may have the same frequency and phase as a signal output by the VCO on line 650, such as where line 645 is coupled to line 650 with a low or zero impedance electrical connection.

In some embodiments, the fast lock PLL circuit 410 may be described as having two control loops or feedback loops. The first control loop (which may be described as a complementary, secondary or second feedback loop, such as a loop that may not be able to lock the frequency and/or phase of the PLL) includes the first control element 605, the control loop filter 620, the VCO 615, and the feedback signal line 645. The second control loop (which may be described as a primary or first feedback loop, such as a loop that is able to lock the phase as well as the frequency of the PLL) includes the second control element 610, the control loop filter 620, the VCO 615, and the feedback signal line 645. Although the first control loop may dominate the second control loop at magnitude or speed of control or change of the output of voltage to the VCO 615 during operation, the first and second control loops operate in parallel to facilitate the fast lock operations described herein.

The first control element 605 may receive a reference signal 640 from the reference line 640 and a feedback signal 645 from the feedback line 645. In one embodiment, the first control element 605 may detect (e.g., count, determine, and/or compare) a frequency of the feedback signal 645 and a frequency of the reference signal 640 (e.g., count, determine, and/or compare). In response to detecting a frequency difference (e.g., by counting and/or comparing a count of the frequency or edges of a waveform of both signals with respect to time), as described further with reference to FIGS. 7-13C, the first control element 605 may adjust the frequency of the feedback signal 645 until the frequency of the feedback signal 645 is within a predetermined range of the frequency of the reference signal 640. In one embodiment, addition of the first control element 605 may reduce signal locking times from about 3.0-3.5 μsec to about 0.5-1.0 μsec.

The second control element 610 may also receive the reference signal 640 from the reference line 640 and the feedback signal 645 from the feedback line 645. In one embodiment, the second control element 610 may tune the phase and the frequency of the feedback signal 645 until the phase and the frequency of the feedback signal 645 are synchronized or phase-locked with the reference signal 640.

In one embodiment, the control loop filter 620 includes at least one resistor 630 and at least one capacitor 625. Additionally, the control loop filter 620 may include a connection to ground 635. In some embodiments, the control loop filter 620 may be connected to a control node of the VCO 615 and provide a control voltage (vctrl) for regulating the frequency of the output signal. In a further embodiment, the capacitor 625 may provide the primary voltage reference for controlling the frequency of the output signal.

Even though only one capacitor 625 is shown in the control loop filter 620, other embodiments may include configurations where a second capacitor is present at the control node of the VCO 615. Additionally, other configurations having more capacitors and/or resistors may be implemented. In some embodiments, one capacitor may be referred to as the main loop filter capacitor. Alternatively, the configuration may include a large capacitor with which the terminal voltage has a direct correlation to the frequency of the VCO 615. Also, references to an output from the VCO 615 may refer to outputs which may or may not have a divider in the signal path.

The first control element 605 may connect directly to the capacitor 625. Consequently, when the first control element 605 applies a charge to the capacitor 625, the voltage across the resistor 630 may remain substantially unchanged. For example, the first control element 605 may apply a charge to (e.g., pump positive or negative current into) the capacitor 625, such as to control a voltage across or stored in the capacitor, in order to control the control voltage and/or output frequency of VCO 615. Therefore, the first control element 605 may make rapid adjustments to the reference voltage at the control node, relative to the rate of tuning in the second control element 610, without overshooting the frequency of the reference signal 640 and without creating an unstable output signal.

Conversely, the second control element 610 may couple to the control node of the VCO 615 as well as to the resistor 630 of the control loop filter 620. In such an embodiment, the voltage on the resistor 630 and the capacitor 625 may change as the second control element 610 applies a charge (e.g., positive or negative current using one or more charge pumps, such as using a primary charge pump (PCP)) to the control loop filter 620. However, the voltage change on the resistor 630 may be temporary, lasting only as long as the flow of charge is supplied by the second control element 610. Thus, the second control element 610 may gradually tune the phase and frequency of the output signal 650 and associated feedback signal 645 until the feedback signal 645 is phase locked (e.g., phase and frequency locked) with the reference signal 640.

Figure 7A:
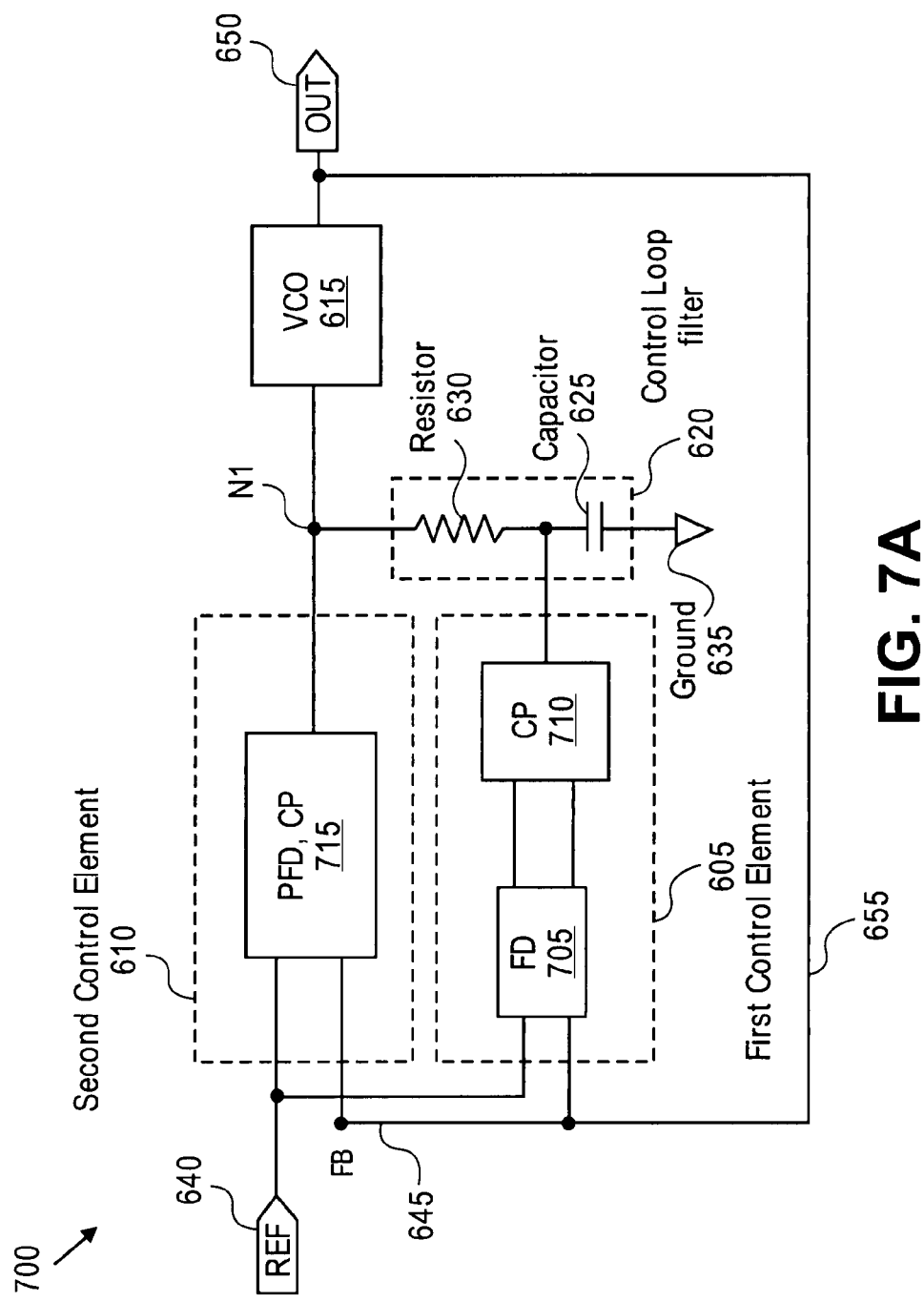
FIG. 7A illustrates a detailed block diagram of one embodiment of a fast lock PLL circuit.

FIG. 7A illustrates a detailed block diagram of one embodiment of a fast lock PLL circuit 700. Similar to the PLL 600 described above, the PLL 700 includes a first control element 605, a second control element 610, and a first VCO 615. Additionally, the PLL 700 includes a reference signal line 640, a feedback signal line 645, and an output signal line 650 coupled to the feedback signal line 645 by a feedback loop 655. The PLL 700 also includes a control loop filter 620.

In one embodiment, the first control element 605 includes a frequency detector (FD) 705 and a charge pump (CP) 710. The frequency detector 705 may receive a reference signal 640 from the reference line 640 and a feedback signal 645 from the feedback line 645. In one embodiment, the frequency detector 705 compares the frequency of the feedback signal 645 with the frequency of the reference signal 640 to determine a frequency difference. If the frequency difference is not within a dead zone, described in further detail with reference to FIG. 8A, the frequency detector 705 may signal the charge pump 710 to either increase the voltage level (e.g., electrical potential) of the capacitor 625 if the frequency of the feedback signal 645 is lower than the frequency of the reference signal 640, or decrease the voltage level of the capacitor 625 if the frequency of the feedback signal 645 is higher than the frequency of the reference signal 640, depending on the voltage-frequency characteristic of the VCO 615. In one embodiment, the frequency detector 705 includes a range controller as described in relation to FIGS. 9-13.

The charge pump 710 may regulate the voltage level on the capacitor 625 in response to a signal from the frequency detector 705. Additionally, the charge pump 710 may generate a flow of charge for increasing or decreasing the voltage level on the capacitor 625. In one embodiment, the charge pump 710 includes one or more "Bang-Bang" (i.e., fully on, fully off) charge pump to pump up (e.g., by pumping a positive electronic current to or through the capacitor) and/or pump down (e.g., by pumping a negative electronic current to or through the capacitor).

In the illustrated embodiment, the second control element 610 includes a combination device 715 having a phase-frequency detector (PFD) and charge pump (CP). For example, the second control element 610 may include a combination device 715 commonly used in typical PLL circuits. One of ordinary skill in the art will readily recognize various embodiments of a combination device 715. For example, in some embodiments, the second control element 610 includes a phase-frequency detector (PFD) that is separate from the charge pump, instead of a combination device (e.g., see FIGS. 7B and 7C). Thus, in certain embodiments, typical PLL components may be included in the second control element 610, but the performance of the PLL 700 may be enhanced by implementation of the first control element 605. Some benefits of such an embodiment include low cost of implementation, readily available components, high speed signal locking, and a high level of stability in the PLL output.

Figure 7B:
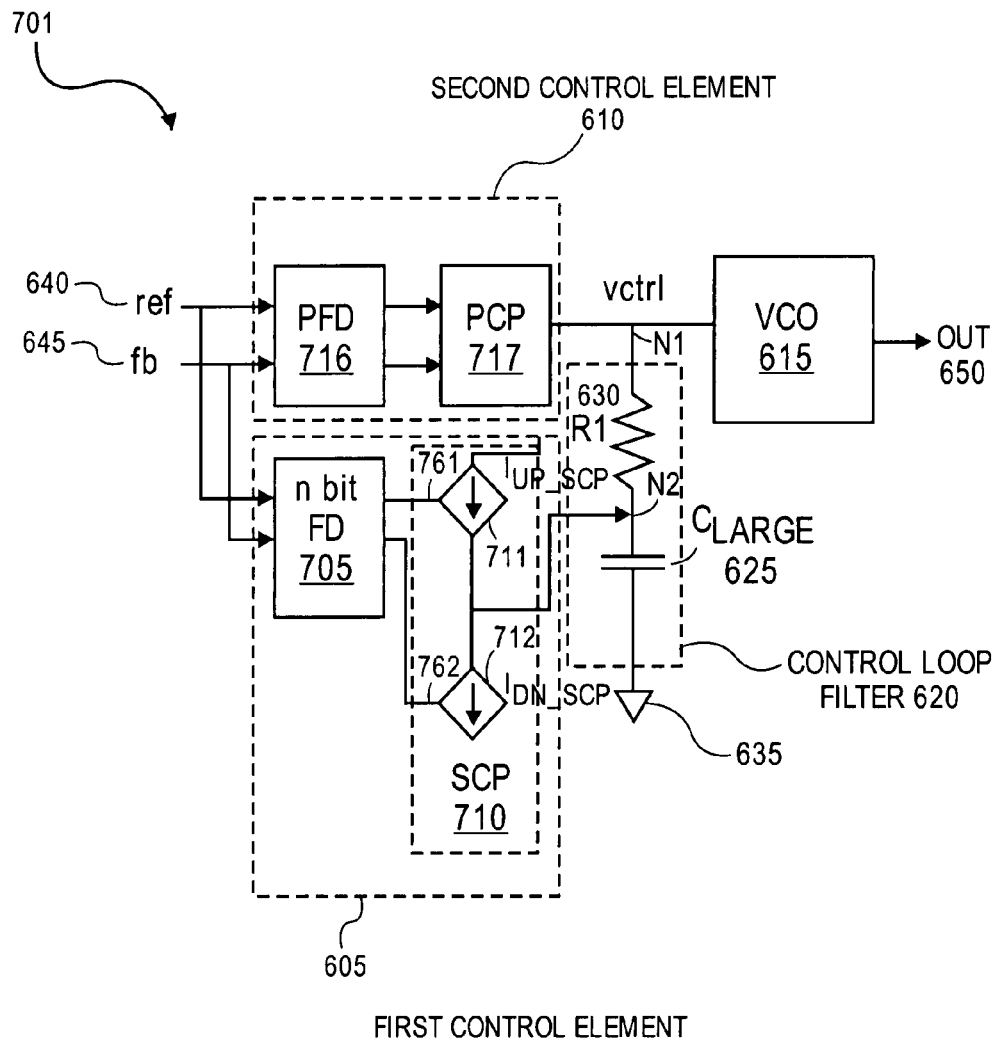
FIG. 7B illustrates a detailed block diagram of one embodiment of a fast lock PLL circuit having an up charge pump and a down charge pump.

FIG. 7B illustrates a detailed block diagram of one embodiment of a fast lock PLL circuit 701 having an up charge pump and a down charge pump. Similar to the PLL 600 and/or 700 described above, the PLL 701 includes a first control element 605, a second control element 610, VCO 615 and control loop filter 620 using feedback signal 645 coupled to output signal 650 through two feedback or control loops. A secondary or second feedback loop may use first control element 605 to synchronize cause the frequency of signal 645 to be within a range of being equal to that of signal 640. During or after the secondary feedback loop synchronizes the frequencies, a primary or first feedback loop may use second control element 610 to synchronize or lock the frequency and phase of signal 645 to be equal to that of signal 640.

PLL 701 also includes reference signal 640. The coupling between feedback signal 645 and output signal 650 may be a feedback loop or otherwise cause the frequency and phase of feedback signal 645 to be equal to that of output signal 650, such as where line 645 is coupled to line 650 with a low impedance electrical connection.

In FIG. 7B, the second control element 610 is shown including a phase-frequency detector (PFD) 716 that is separate from primary charge pump (PCP) 717 (separate, such as by being a separate component, chip, circuit, device or an a separate printed circuit board from the pump). The output of PFD 716 may be two outputs of pulse lengths, where each varies with respect to the other in timing or synchronization and pulse width depending on the frequency and phase of reference signal 640 and feedback signal 645, respectively, such as is known in the art. When PLL 701 is locked or the phase and frequency of reference signal 640 and feedback signal 645 are equal or the same, the outputs of PFD 716 may be synchronized and have the same pulse width.

Additionally, the PLL 701 includes secondary charge pump 710 having pump up charge pump 711 (Iup_SCP) to receive "up" signal 761 from detector 705; and pump down charge pump 712 (Idn_SCP) to receive "down" signal 762 from detector 705. For instance, pump up charge pump 711 and pump down charge pump 712 may be coupled to frequency detector 705 to provide charge or current to capacitor 625, such as is described above for detector 705 and charge pump 710. More particularly, charge pump 711 may receive a signal from detector 705 and provide current $I_{UP\_SCP}$ to increase the voltage level of capacitor 625 if the frequency of signal 645 is lower than frequency of signal 640. Alternatively, detector 705 may signal pump down charge pump 712 to remove or subtract current $I_{DN\_SCP}$ to decrease the voltage level of capacitor 625 if the frequency of signal 645 is higher than the frequency of signal 640. These currents may be provided at (e.g., pumped up or down to) capacitor node N2 (e.g., a node or contact of capacitor 625 electrically opposite or away from ground). According to embodiments, detector 705 may at the same time either provide signal 761 to pump 711, provide signal 762 to pump 712, or provide a signal to neither pump. In some embodiments, detector 705 will not provide a signal to both charge pumps at the same time.

Figure 7C:
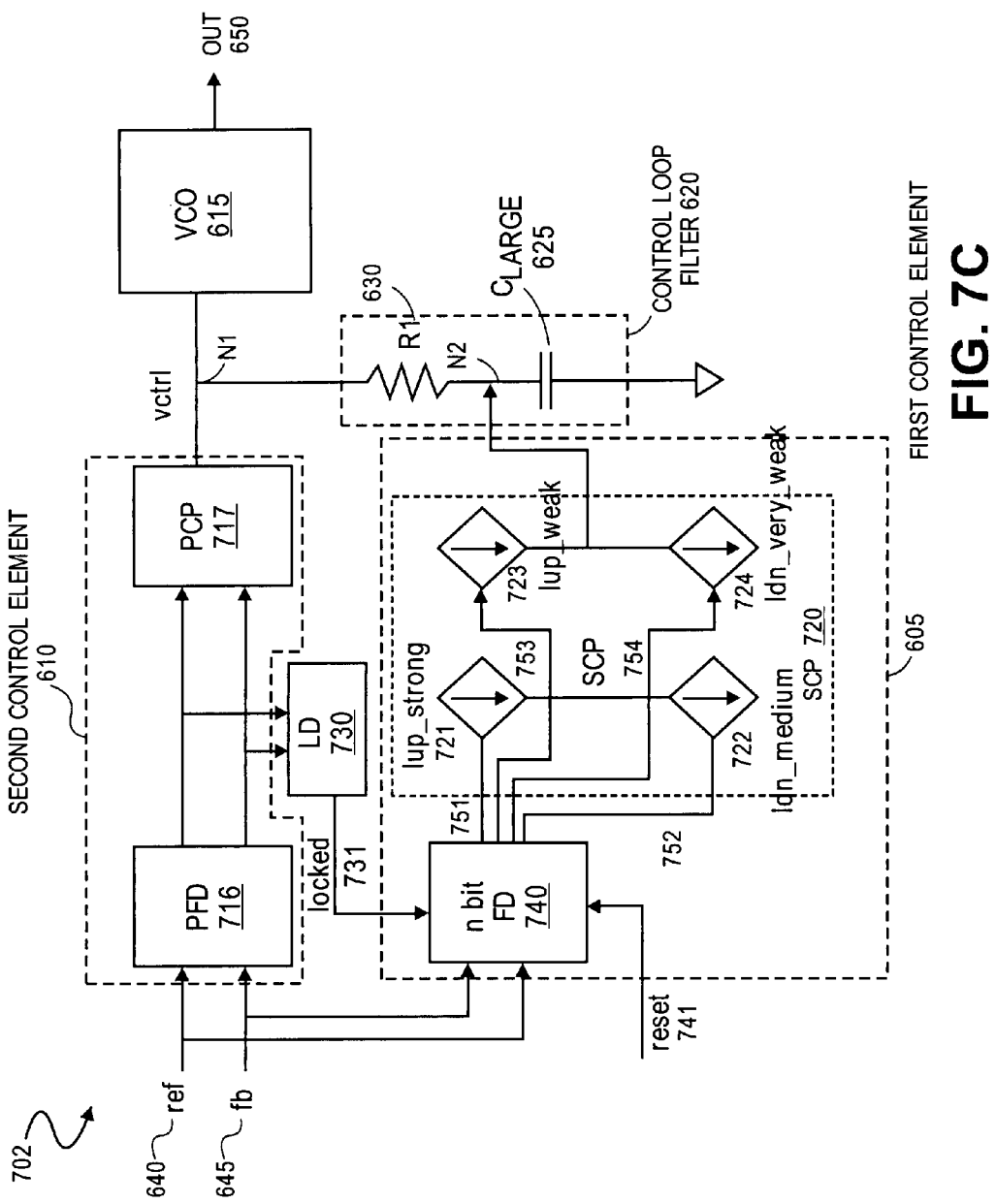
FIG. 7C illustrates a detailed block diagram of one embodiment of a fast lock PLL circuit having two up charge pumps and two down charge pumps.

FIG. 7C illustrates a detailed block diagram of one embodiment of a fast lock PLL circuit 702 having two up charge pumps and two down charge pumps. Similar to the PLL 600, 700, and/or 701 described above, the PLL 702 includes a first control element 605, a second control element 610, VCO 615 and control loop filter 620 using feedback signal 645 coupled to output signal 650 through two feedback or control loops. Thus, a secondary feedback loop may use first control element 605 to synchronize cause the frequency of signal 645 to be within a range of that of signal 640.

Instead of charge pumps 710, PLL 702 uses charge pump 720 (e.g., SCP 720) to provide charge or current to capacitor 625. Charge pump 720 includes two up charge pumps to increase the charge or voltage across capacitor 625, and two down charge pumps to decrease the charge or voltage across capacitor 625. Specifically, charge pump 720 includes pump up (strong), pump down (medium) charge pump 722 to provide Idn_medium current to capacitor 625; pump up (weak) charge pump 723 to provide Iup_weak current to capacitor 625; and pump down (very_weak) charge pump 724 to provide Idn_very_weak current to capacitor 625. These currents may be provided at (e.g., pumped up or down to) capacitor node N2 (e.g., a node or contact of capacitor 625 electrically opposite or away from ground). The charge magnitude of each pump is described relative to the other pumps. Thus, the magnitude of charge output by strong is greater than that of medium, which is greater than that of weak, which is greater than that of very weak. The polarity of charge pumped up is positive current (e.g., holes pumped) into node N2 of capacitor 625. The polarity of charge pumped down is negative current (e.g., electrons pumped) into node N2 of capacitor 625. In some cases, the magnitude of medium may be 50 percent of, the magnitude of weak may be 20 percent of, and the magnitude of very weak may be 10 percent of the magnitude of strong. However, these numbers are not meant to be limiting as other percentages may be used.

Frequency detector 740 may provide signals 751, 752, 753, and 754 respectively, to charge pump 721, 722, 723, and 724 based on determining (e.g., receiving, counting, or detecting) the frequencies of reference signal 640 and feedback signal 645. In addition, frequency detector 740 may provide signals 751, 752, 753, and 754 based on receiving (e.g., detecting) locked signal 731, and/or reset signal 741. For example, detector 740 may send and pump 721 may receive Pup_strong signal 751 causing charge pump 721 to provide Iup_strong current to capacitor 625 to increase the voltage level of capacitor 625 at a faster rate if the frequency of signal 645 is determined to be less than the frequency of signal 640. This situation may arise when the frequency difference between signal 640 and 645 (e.g., frequency of signal 640 minus frequency of 645) is determined to be within region 821 as shown in FIG. 8B, and/or when logic 1002 receives signal 1015 but not signal 1021 as shown in FIG. 10B. Similarly, for example, detector 740 may send and pump 722 may receive Pdown_medium 752 causing charge pump 722 to provide Idown_medium current to capacitor 625 to decrease the voltage level (e.g., by removing or subtracting current at node N2) of capacitor 625 at a faster rate if the frequency of signal 645 is determined to be greater than the frequency of signal 640. This situation may arise when the frequency difference between signal 640 and 645 (e.g., frequency of signal 640 minus frequency of 645) is determined to be within region 822 as shown in FIG. 8B, and/or when logic 1002 receives signal 1020 but not signal 1016 as shown in FIG. 10B.

Also, for example, detector 740 may send and pump 723 may receive Pup_weak signal 753 causing charge pump 723 to provide Iup_weak current to capacitor 625 to increase the voltage level of capacitor 625 at a slower rate if the frequency of signal 645 is determined to be less than the frequency of signal 640. This situation may arise when the frequency difference between signal 640 and 645 (e.g., frequency of signal 640 minus frequency of 645) is determined to be within region 823 as shown in FIG. 8B, and/or when logic 1002 receives signal 1015 and signal 1021 as shown in FIG. 10B. Similarly, for example, detector 740 may send and pump 724 may receive Pdown_very_weak 754 causing charge pump 724 to provide Idown_very_weak current to capacitor 625 to decrease the voltage level of capacitor 625 at a slower rate if the frequency of signal 645 is determined to be greater than the frequency of signal 640. This situation may arise when the frequency difference between signal 640 and 645 (e.g., frequency of signal 640 minus frequency of 645) is determined to be within region 824 as shown in FIG. 8B, and/or when logic 1002 receives signal 1020 and signal 1016 as shown in FIG. 10B.

Frequency detector 740 may signal the charge pump using a signal line as known in the art. Moreover, while detector 740 is providing a signal to any of the charge pumps, that charge pump may be providing the current or charge of that charge pump to capacitor 625 to increase or decrease the charge or voltage across capacitor 625 to control the output frequency of VCO 615.

In some embodiments, detector 740 may send a signal to pump 721, 722, 723, or 724, but not to any two pumps at one time. In addition, such as when the difference between the reference signal and the feedback signal is in the dead zone, detector 740 may not send a signal to any of the charge pumps. Also, for convenience, reference to the signal 761, 762, 751, 752, 753, and/or 754 may refer to the physical communication medium (e.g., wires) or to a signal on the corresponding line, unless indicated otherwise.

In some cases, the frequency detector 740 has inputs to receive a reset signal 741 and/or a locked signal 731 (e.g., from lock detector 730, such as to indicate the PLL is locked). Receipt of the reset 741 signal may cause the frequency detector 740 (and/or logic 1002) to signal 751 to activate strong pump up charge pump 721 prior to detecting a frequency difference between the reference signal and the feedback signal. Reset signal 741 may be supplied to detector 740, or received or detected by detector 740 from a power-on/reset circuit or device, as known in the art, which may be part of PLL 702, external to PLL 702, or part of another circuit or device.

Receipt of the locked signal 731 may cause the frequency detector 740 (e.g., logic such as OR gates 1035 and 1040) to stop or discontinue detecting (e.g., discontinue counting or comparing) a frequency difference between the reference signal and the feedback signal. Locked signal 631 may be supplied by locked detector (LD) 730, such as a detector coupled to the two outputs of PFD 716 to determine if a lock has been reached or accomplished by monitoring the synchronization and pulse width of the outputs of PFD 716. As noted above, if the signal from the two outputs of PFD 716 are synchronized and the pulses are of equal width, a lock may be detected by LD 730 identifying that the phase and frequency of signal 640 is equal to that of 645. In this case, LD 730 may output a signal on locked 731 to be detected or received by detector 740, as known in the art.

Figure 8A:
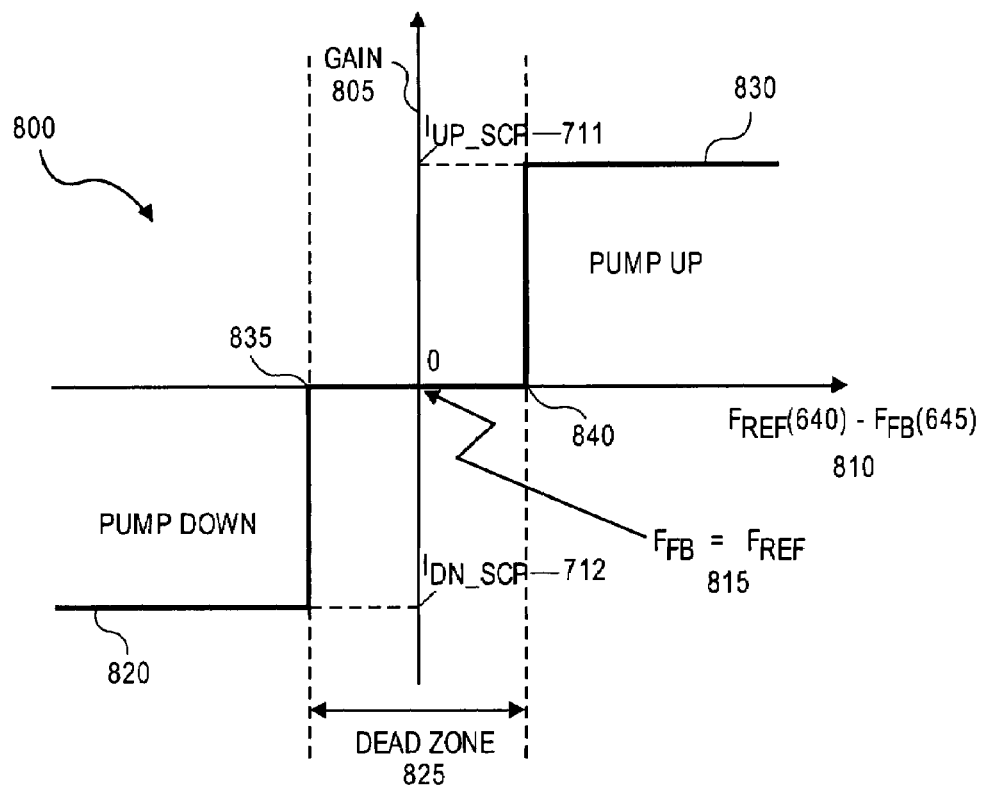
FIG. 8A illustrates one embodiment of a first control element output as a function of a frequency difference between a reference signal and a feedback signal.
Figure 8B:
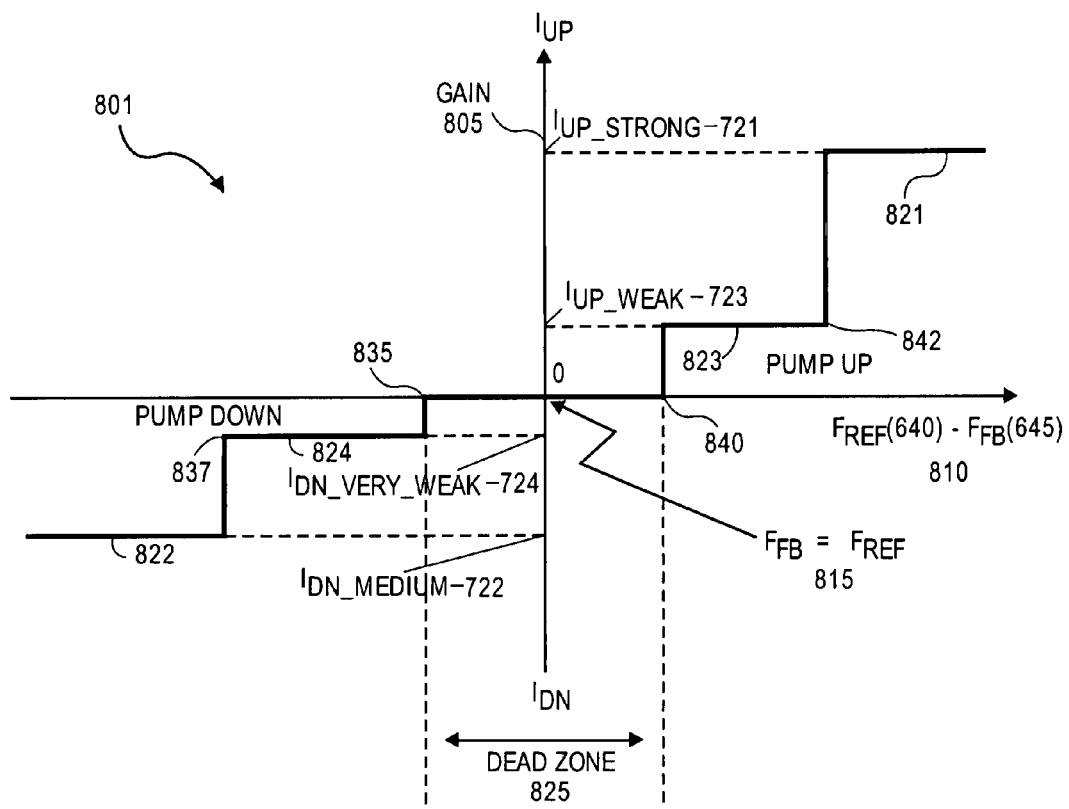
FIG. 8B illustrates one embodiment of a first control element output as a function of a frequency difference between a reference signal and a feedback signal.

FIG. 8A illustrates one embodiment of a graphical representation of the output 800 of a first control element 605 as a function of (e.g., based on) a frequency difference between the reference signal 640 and the feedback signal 645. The y-axis 805 represents the output of the first control element 605 and the x-axis 810 represents the frequency difference between the reference signal 640 and the feedback signal 645 (e.g., the frequency of signal 640 ($F_{REF}$) minus or less the frequency of signal 645 ($F_{FB}$)). The line 815 on the x-axis 810 represents where the frequency of the reference signal 640 is equal to the frequency of the feedback signal 645.

The characteristic curve of the output of the first control element 605 includes three main regions: a negative region 820, a zero range or region 825, and a positive region 830. The zero region 825 may also be referred to as the "dead zone" or "dead zone" range. In one embodiment, the dead zone 825 is defined by a lower threshold frequency 835 and an upper threshold frequency 840. In certain embodiments, the dead zone 825 is centered on the zero frequency difference line 815. The negative region 820 includes frequencies below the lower threshold frequency 835, and the positive region 830 includes frequencies above the upper threshold frequency 840.

In some embodiments, the charge pump 710 assigns a sign to the output signal of the charge pump 710 according to the region in which frequency difference 810 is located. For example, the frequency detector 705 may generate an "up" signal 761 to the up charge pump 711 when the frequency difference 810 is in the negative region 820 between 0 Hz and the lower threshold frequency 835. Alternatively, the frequency detector 705 may generate a "down" signal 762 to the charge pump 712 when the frequency difference 810 is in the positive region 830 above the upper threshold frequency 840. In one embodiment, when the frequency difference 810 is in the predetermined dead zone 825, the frequency detector 705 does not communicate a signal either of the charge pumps 711 or 712. One example of a frequency detector 705 that may exhibit the characteristics described above of FIG. 8A is a symmetrical range controller 1000, as described in relation to FIG. 10A below.

FIG. 8B illustrates one embodiment of a graphical representation of the output 801 of a first control element 605 (e.g., charge pump 720) as a function of (e.g., based on) the frequency of the feedback signal 645 and the frequency of the reference signal 640 (e.g., as a function of a frequency difference between the reference signal 640 and the feedback signal 645). The x-axis 810 represents the frequency difference between the reference signal 640 and the feedback signal 645. The line 815 on the x-axis 810 represents where the frequency of the reference signal 640 is equal to the frequency of the reference signal 640. The y-axis 805 represents the output of the first control element 605 (e.g., the output of charge pump 720), such as the current gain 805 pumped by charge pumps 721-724 as a result of the difference 810.

The characteristic curve of the output of charge pump 720 includes five main regions: first negative region 824 corresponding to charge or current provided by pump down charge pump 724, second negative region 822 corresponding to the output of second charge down charge pump 722, zero region 825, first positive region 823 corresponding to the current output of pump up charge pump 723, and second positive region 821 corresponding to the current output of pump up charge pump 721. It can be appreciated that each of the regions and currents shown may correspond to an output of the frequency detector on signal lines 751-754 as described above. For example, region 821 may correspond to the output of pump 721 when detector 740 is outputting signal 751, region 823 may correspond to the output of pump 723 when detector 740 is outputting signal 753, region 824 may correspond to the output of pump 724 when detector 740 is outputting signal 754, and region 822 may correspond to the output of pump 722 when detector 740 is outputting signal 752. One example of a frequency detector 740 that may exhibit the characteristics described of FIG. 8B above is a symmetrical range controller 1001, as described in relation to FIG. 10B below.

Figure 9:
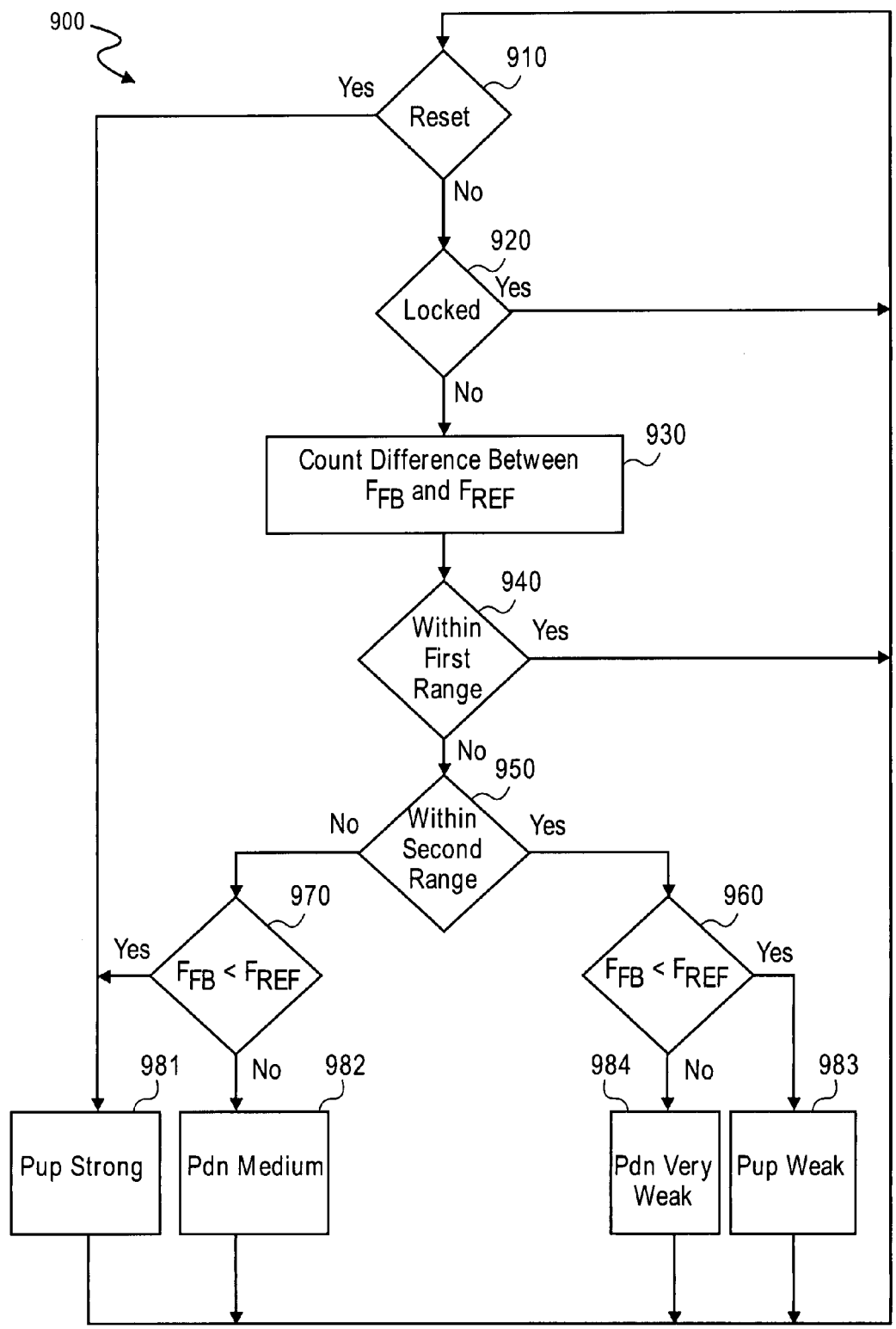
FIG. 9 illustrates a flow chart diagram of one embodiment of a process for fast locking signal frequencies and phases.

FIG. 9 illustrates a flow chart diagram of one embodiment of a process for fast locking signal frequencies and phases. FIG. 9 shows process 900 for fast locking signal frequencies and phases, such as using a first and second control element; and/or a first and second feedback loop as described herein.

At block 910 it is determined whether a reset signal has been received, such as at a reset signal input, circuit, or logic of frequency detector 740 (e.g., such as receiving signal 741 at detector 740 as shown in FIG. 7C); or received at counter 1005 and 1010 of detector 740 as shown in FIG. 10B). Such a signal may be received from a power-on or a reset signal generator external to, or as part of, the PLL. If a reset signal is or has been received at block 910 (such as when a reset signal has been received since the last time process 900 was at block 910) processing continues to block 981 where a Pup strong charge current is generated by the first control element, prior to or simultaneously with counting a frequency difference between a reference signal and a feedback signal (e.g., the Pup strong current may be generated and counting as described for block 930 below may begin simultaneously, in some embodiments). In some cases, if a reset signal is received at block 910, logic gate, such as gates that are part of detector 740 and/or counters 1005 and 1010 cause control element 605 to signal charge pump 721 with signal 751 based on or resulting from receiving the reset signal, and prior to counting a frequency difference between a reference signal and a feedback signal of the PLL.

If a reset signal is not received at block 910, processing continues to block 920. At block 920 it is determined whether a phase locked signal has been received, such as by a phase locked signal input, circuit, or logic of detector 740. For example, block 920 may include determining whether locked signal 731 is received, such as at a locked signal input, circuit, or logic of frequency detector 740 (e.g., such as receiving signal 731 at detector 740 as shown in FIG. 7C); or received at OR gates (e.g., logic) 1035 and 1040 of FIG. 10B. The locked signal may indicate that the phase and frequency of a feedback signal and a reference signal are locked or equal, such that the phase difference and frequency difference between those signals is zero. If a locked signal is received at or prior to block 920 (such as by receiving the locked signal since the last time process 900 was at block 920) processing returns to block 910. In some cases, returning to block 910 from block 920 includes causing control element 605 to discontinue adjusting a voltage across capacitor 625, based on or as a result of receiving the locked signal. Similarly, going to block 910 from block 920 may include discontinuing determining, counting, or comparing a reference signal to a feedback signal, such as by discontinuing detection of frequencies by detector 740; or discontinuing counting or comparing of frequencies by counter 1005 and 1010. A locked signal at 920 may indicate that the reference signal and the feedback signal are synchronized with respect to phase and frequency.

If at block 920 a locked signal is not received or does not exist, processing continues to block 930. At block 930 a difference between the frequency of a feedback signal and the frequency of a reference signal is counted, compared, detected, or determined. Block 930 may include processing or descriptions described herein with respect to frequency detector 740, counter 1005, counter 1010, logic 1002, FIG. 11 (e.g., process 1100), and FIGS. 12 and 13A-13C. After or during counting of block 930, it is determined at block 940 whether the difference is within a first range, such as by being within a dead zone as described herein. If at block 940 the difference is within a first range, processing returns to block 910. Such return may indicate that inhibit signals have been sent between the two halves of the frequency detector counters as described for counters 1005 and 1010, and/or FIGS. 12 and 13B. Such return may also include first element 605 discontinuing adjusting the frequency of the VCO 615 or the charge across capacitor 625.

If at block 940 the difference is not within the first range, processing continues to block 950. After or during counting the difference at block 930, at block 950 it is determined whether the difference is within a second range, such as a range larger than and overlapping the first range of block 940. It can be appreciated that at block 950 it has already been determined that the difference is greater than the first range, such as being above an upper threshold or below a lower threshold of the first range. Block 950 may correspond to descriptions for detector 740 determining whether an up signal, a down signal, an end signal, and/or an advance signal has been detected by detector 740, counter 1005, counter 1010, and/or logic 1002 as described for FIGS. 7C, 10, 12, 13A and 13C.

If at block 950 it is determined that the difference is not within the second range, processing continues to block 970. It can be appreciated that determining that the difference is not within the second range may include a determination that the difference is greater than the second range or outside the second range, such as by being above or greater than an upper threshold of the second range; or below or less than a lower threshold of the second range.

On the other hand, if the difference is within the second range, processing continues to block 960. It can be appreciated that determining the differences within the second range may include determining the differences less than or below an upper threshold of the second range but greater than or above an upper threshold of the first range; or greater than or above a lower threshold of the second range but below or less than a lower threshold of the first range.

At block 960 it is determined whether the frequency of the feedback signal is less than the frequency of the reference signal. If the frequency of the feedback signal is less than the frequency of the reference signal, processing continues to block 983 where Pup weak current is generated by the first control element. Alternatively, if at block 960 it is determined that the frequency of the feedback signal is not less than a frequency of the reference signal (e.g., such as where the frequency of the feedback signal is greater than the frequency of the reference signal) processing continues to block 984 where Pdn very weak current is generated by the first control element. Note that since the difference between the frequencies is not within the first range at block 940, it is not possible that the frequencies are equal at block 960.

At block 970 it is determined whether the frequency of the feedback signal is less than the frequency of the reference signal. If the frequency of the feedback signal is less than the frequency of the reference signal, processing continues to block 981 where Pup strong current is generated by the first control element. Alternatively, if at block 970 it is determined that the frequency of the feedback signal is not less than a frequency of the reference signal (e.g., such as where the frequency of the feedback signal is greater than the frequency of the reference signal) processing continues to block 982 where Pdn medium current is generated by the first control element. Note that since the difference between the frequencies is not within the first range at block 940, it is not possible that the frequencies are equal at block 970.

Thus, pumping charge at blocks 981, 982, 983, and 984 may include descriptions herein with respect to signals 751-754, 1015, 1016, 1020, 1021, and current 721-724. Also it may be noted that during process 900, a first feedback loop or second control element may be determining a difference between the phase and frequency of the feedback and reference signals, and adjusting the voltage across the capacitor using a primary charge pump.

Figure 10A:
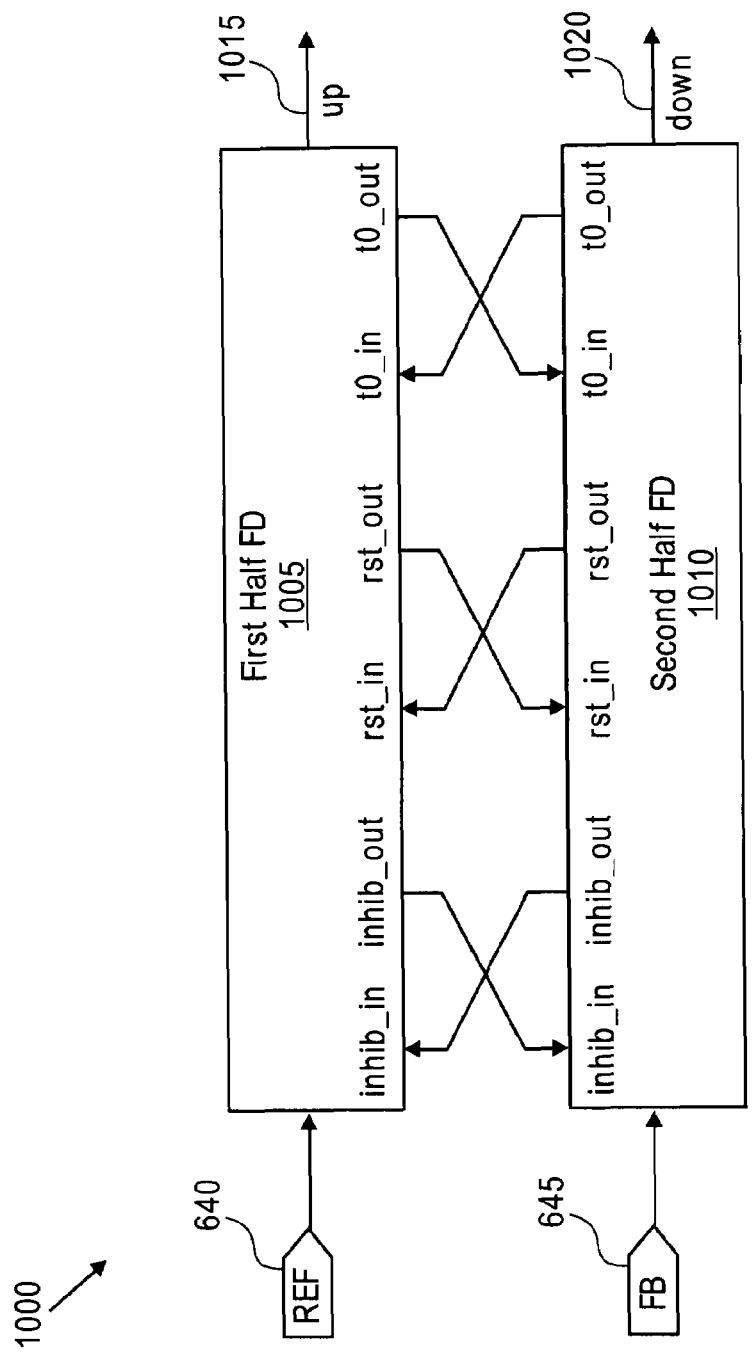
FIG. 10A illustrates a block diagram of one embodiment of a symmetrical range controller.
Figure 10B:
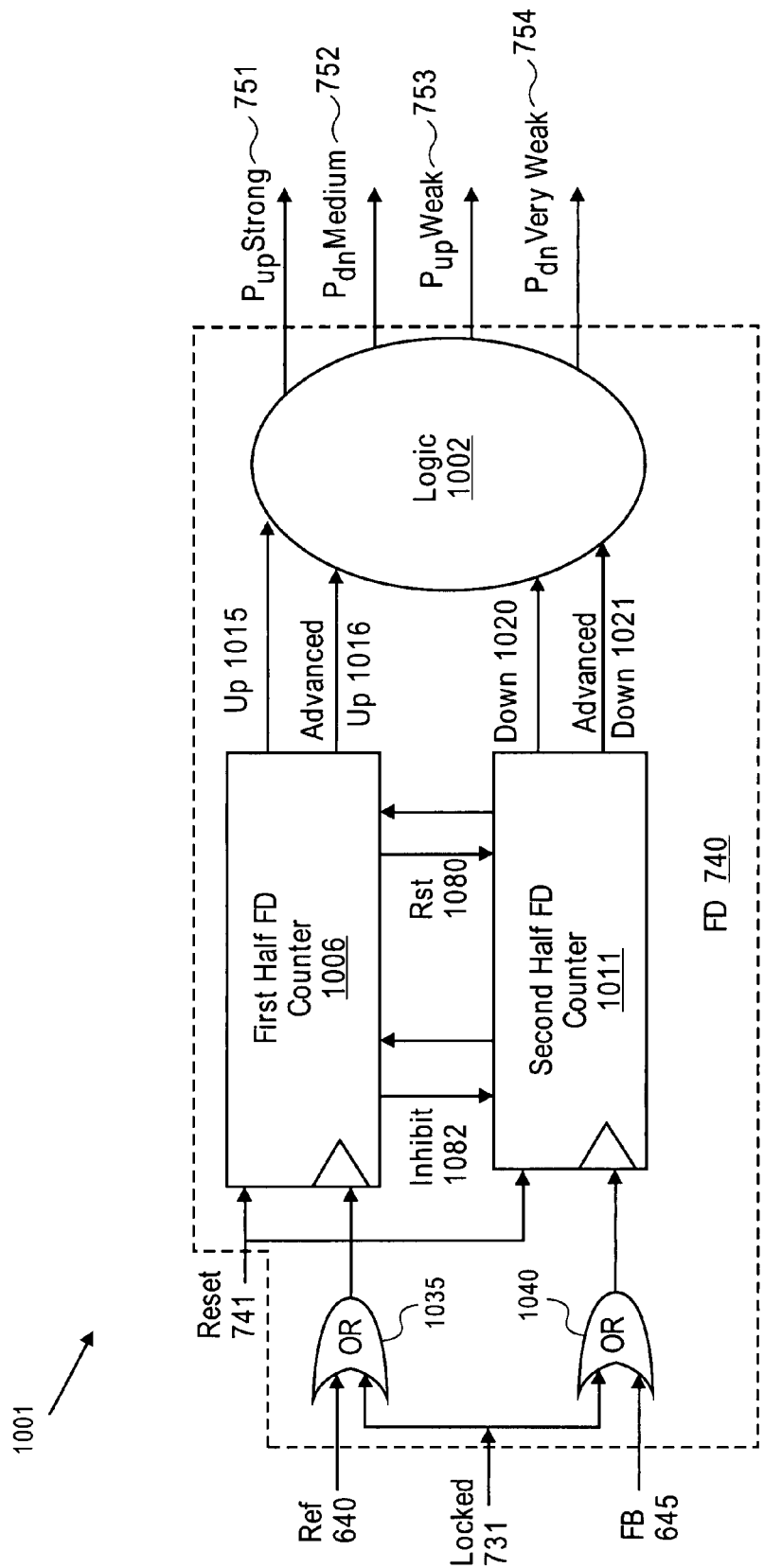
FIG. 10B illustrates a block diagram of one embodiment of a symmetrical range controller.

FIG. 10A illustrates a block diagram of one embodiment of a symmetrical range controller 1000. In some embodiments, the frequency detector 705 includes the symmetrical range controller 1000. The illustrated symmetrical range controller 1000 includes a first half 1005 and a second half 1010. The symmetrical range controller 1000 may be described as "symmetric" because the first half 1005 and the second half 1010 may be substantially identical. Each half receives an input signal and generates one or more outputs to the charge pump 710. Additionally, in some cases, both halves may transmit and receive a set of handshake signals.

The first half 1005 may receive the reference signal 640 from the reference signal line 640. The second half 1010 may receive the feedback signal 645 from the feedback signal line 645. Additionally, the first half 1005 may generate an up output signal 1015 and the second half 1010 may generate a down output signal 1020. In one embodiment, the frequency detector 705 may generate either the up output signal 1015 or the down output signal 1020 at a time, but not both concurrently. Thus, it may be said that the range controller 1000 is configured to count the frequency difference between the signal 645 and the signal 640 and to signal the charge pumps in response to a determination the frequency of the 645 signal is outside of a predetermined range (e.g., outside of the dead zone) of the frequency of the signal 640.

Figure 12:
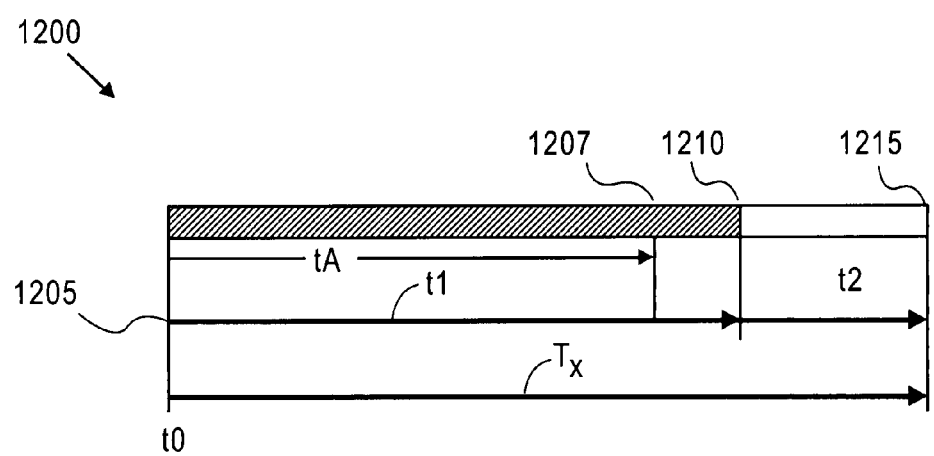
FIG. 12 illustrates a timing diagram of one embodiment of either half of a symmetrical range controller response.

As further described in relation to FIGS. 12-13, the first half frequency detector 1005 may inhibit the second half frequency detector 1010 when a counter portion of the first half frequency detector 1005 reaches the threshold count 1210/1310. Alternatively, the second half frequency detector 1010 may inhibit the first half frequency detector 1005 in a like manner. The inhibit signal is passed between the first half frequency detector 1005 and the second half frequency detector 1010 by the cross-connected inhib_in and inhib_out lines.

Additionally, the first half frequency detector 1005 or the second half frequency detector 1010 may signal its counterpart to reset in response to reaching a full count 1215. In one embodiment, the reset signal is communicated via the cross-connected rst_in and rst_out lines. In a further embodiment, either half frequency detector 1005 or 1010 may signal its counterpart to clear previously set inhibit signals and output signals through the cross-connected t0_in and t0_out lines.

FIG. 10B illustrates a block diagram of one embodiment of a symmetrical range controller 1001. In some embodiments, the frequency detector 740 includes the symmetrical range controller 1001. The illustrated symmetrical range controller 1001 includes a first half 1006 and a second half 1011. The symmetrical range controller 1001 may be described as "symmetric" because the first half 1006 and the second half 1011 may be substantially identical. Each half receives an input signal and generates outputs to the charge pump 720. Additionally, in some cases, both halves may transmit and receive a set of handshake signals.

The first half 1006 may receive the reference signal 640 from the reference signal line 640. The second half 1011 may receive the feedback signal 645 from the feedback signal line 645. Additionally, the first half 1006 may generate an up output signal 1015 and/or an advanced up signal 1016 to logic 1002. Also, the second half 1011 may generate a down output signal 1020 and/or an advanced down signal 1021 to logic 1002. In one embodiment, the frequency detector 740 may generate either the up output signal 1015 or the down output signal 1020 at a time, but not both concurrently.

As further described in relation to FIGS. 12-13, the first half frequency detector 1006 may inhibit the second half frequency detector 1011 when a counter portion of the first half frequency detector 1006 reaches the threshold count 1210/1310. Alternatively, the second half frequency detector 1011 may inhibit the first half frequency detector 1006 in a like manner. The inhibit signal 1082 is passed between the first half frequency detector 1006 and the second half frequency detector 1011 by the cross-connected inhibit lines.

Figure 11:
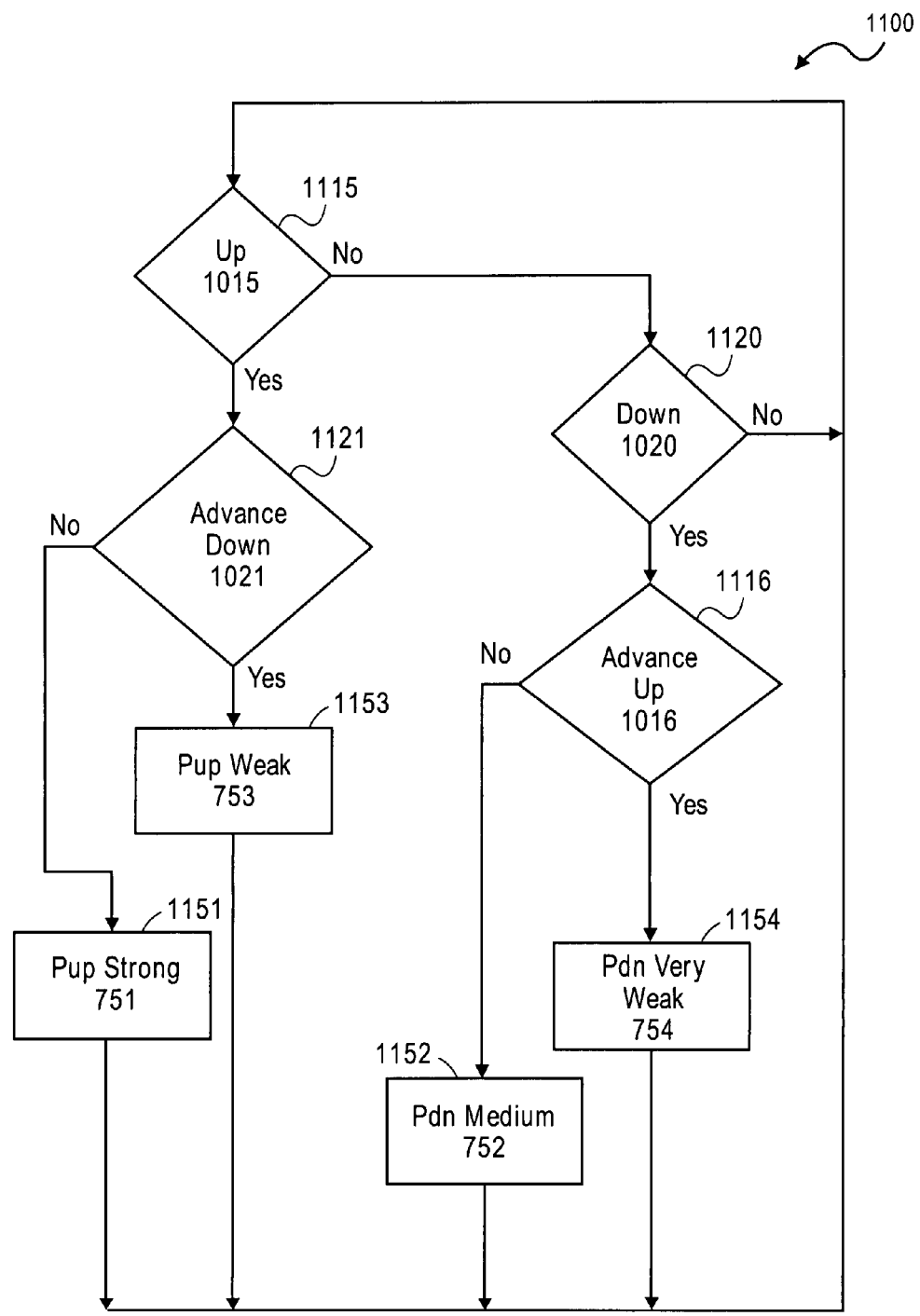
FIG. 11 illustrates a flow chart diagram of one embodiment of a method of determining which charge pump to signal given outputs of a range controller.

As further described in relation to FIGS. 11-13, the first half frequency detector 1006 may send an advanced up signal 1016 to logic 1002 when a counter portion of the first half frequency detector 1006 reaches the threshold count 1207/1307. Alternatively, the second half frequency detector 1011 may send an advanced down signal 1021 to logic 1002 when the second half frequency detector 1011 reaches the threshold count 1207/1330. The advanced signals may be used by logic 1002 to determine whether to send a stronger (e.g., Pup Strong or Pdn Medium) or weaker (e.g., Pup weak or Pdn Very Weak) activation signal to the corresponding charge pump.

Additionally, the first half frequency detector 1006 or the second half frequency detector 1011 may signal its counterpart to reset in response to reaching a full count 1215/1315/1335. In one embodiment, the reset signal 1080 is communicated via the cross-connected reset lines. In a further embodiment, either half frequency detector 1006 or 1011 may signal its counterpart to clear previously set inhibit signals, advanced signals, and output signals through the cross-connected t0_in and t0_out lines.

Thus, it may be said that the range controller 1001 is configured to count the frequency difference between the signal 640 and the signal 645 and to signal the charge pumps to reduce the frequency difference between the signals at a first rate while the frequency difference is outside a first predetermined range (e.g., outside of the dead zone; or in response to a determination the frequency of the 645 signal is outside of a predetermined range of the frequency of the signal 640). In addition, it may be said that the range controller 1001 is configured to count the frequency difference and to signal the charge pumps to reduce the frequency difference between the signals at a faster second rate (e.g., faster than the first rate) while the frequency difference is outside a second predetermined range, which is greater in range than and overlaps the first predetermined range (e.g., in response to a determination the frequency of the 645 signal is outside of a second predetermined range of the frequency of the signal 640).

Detector 740 is shown including OR gate or logic 1035 and 1040 receiving locked signal or line 731. OR gate 1035 also receives reference signal or line 640, while OR gate 1040 receives feedback signal or line 645. The output of OR gate 1035 is received by counter 1006, such as by an inverted input of counter 1006. Similarly, the output of OR gate 1040 is received by counter 1011, such as by an inverted input of counter 1011. It can be appreciated that if a locked signal is high or received by OR gates 1035 and 1040, the output of the OR gates will be high, thus inhibiting or discontinuing counting by counter 1006 and 1011.

Detector 740 also receives reset signal or line 741. For example, circuitry or logic of counter 1006 and 1011 may receive reset signal or line 741. The logic or circuitry of counter 1006 may, upon receipt of signal 741, automatically output up signal 1015, while, upon receipt of signal 741, counter 1011 may automatically output advanced down signal 1021. Thus, receipt of reset signal 741 by detector 740 may cause output of signal 751 by logic 1002.

Locked signal or line 731 may be received by a locked signal input of detector 740, such as where that input is OR gate 1035 and 1040. Likewise, receipt of signal or line 741 by detector 740 may be received by a reset signal input, such as logic or circuitry of counter 1006 and 1011.

FIG. 11 illustrates a flow chart diagram of one embodiment of a method of determining which charge pump to signal given outputs of a range controller. FIG. 11 shows process 1100 such as a process logic 1002 uses (e.g., a process detector 740 or logic 1002 is based on, is configured to follow, or uses). At block 1115 it is determined whether up signal 1015 has been received. It can be appreciated that determining if a signal has been received, may be or include receiving (e.g., monitoring for, receiving, and/or detecting) that signal during (e.g., through) the current count (e.g., from the current t0 through Tx of FIGS. 12-13), until receipt of the next up or down signal at block 1115 (or 1120 in the alternate embodiment), and/or until processing again reaches block 910 of FIG. 9.

If at block 1115 signal 1015 has been received, processing continues to block 1121 where it is determined whether advance down signal 1021 is received. Alternatively, if at block 1115 up signal 1015 is not received, processing continues to block 1120 where it is determined if down signal 1020 has been received. If down signal 1020 has not been received, processing returns to block 1115.

It can be appreciated that positions of blocks 1115 and 1120 can be reversed, such as where block 1120 is executed first and if signal 1020 is not received at block 1120, processing continues to block 1115, and if signal 1015 is not received at block 1115, the process returns to block 1120.

At block 1121, if advance down signal 1021 is not received, processing continues to block 1152 where PUP strong signal 751 is generated. Alternatively, if at block 1021 advance down signal 1020 is received, processing continues to block 1153 where PUP weak signal 753 is generated. If at block 1120 down signal 1020 is received, processing continues to block 1116. At block 1116 it is determined if advanced up signal 1016 is received. If at block 1116 advanced up signal 1016 is not received, processing continues to block 1152 where Pdn medium signal 752 is generated. If at block 1116 advance up signal 1016 is received, processing continues to block 1154 where Pdn very weak signal 754 is generated.

After block 1151, 1152, 1153, or 1154, processing returns to block 1115. In embodiments where blocks 1115 and 1120 are exchanged in order of consideration, as described above, the process would return to block 1120. It can be appreciated that the signals 751-754 for blocks 1151-1154, respectively, may be active, such as through the next count (e.g., from the next t0 through Tx of FIGS. 12-13) or until receipt of the next up or down signal at block 1115 (or 1120 in the alternate embodiment). According to embodiments, signals 751-754 may be active immediately upon logical processing that reaches blocks 981-984 and continue until processing again reaches block 910 of FIG. 9; and/or immediately upon logical processing that reaches blocks 1151-1154 and continue until processing again reaches one of blocks 1151-1154.

According to the concepts here, such as for FIGS. 7C, 9, 10B, and 11-13 various sequences of charge pumping, and/or VCO output frequencies may result during use or pumping by first control element 605 or the secondary feedback loop. For instance, in one sequence, the charge pumping may occur as: Pup strong, Pdown medium, Pup weak, and then Pdown very weak. Also, in another sequence, the charge pumping may occur as: Pup strong, Pdown medium, and then Pup weak. Moreover, in another sequence, the charge pumping may occur as: Pup strong, and then Pup weak. After any of these sequences, the frequency difference may or may not be in the dead zone. If not, the sequence may continue, such as using Pup weak and Pdown very weak as appropriate until the frequency difference is in the dead zone.

In some embodiments, a sequence may include pumping up only once with only Iup_strong to cause the VCO to output signal 650 with a frequency sufficient to cause the frequency difference of signal 640 minus 645 to be within or above the Dead Zone with no further pumping. In other embodiment, a sequence may include pumping up only twice or three times with only Iup_strong to cause the frequency difference of signal 640 minus 645 to be within or above the Dead Zone with no further pumping. The sequences herein are not meant to be limiting as other sequences may be used.

According to embodiments, the concepts herein, such as those for detector 705 and pump 710; or detector 740 and pump 720 may be universally applied to various PLLs. For example, although FIGS. 7C, 9, 10B and 11 describe concepts for 4 charge pumps, those concepts can be applied using various numbers of up and down pumps. For example, the concepts above can be applied for a first control element or secondary charge pump having three pump up and three pump down charge pumps to pump charge for 6 different regions outside the dead zone. It can be appreciated that the concepts above be applied to other combinations such as two up and one down; one up and two down; three up and two down; two up and three down; four up and two down, two up and four down, four up and four down, etc. According to embodiments, the number of up and/or down charge pumps may be predetermined based on the reference frequency, the value of the capacitor 625, and the frequency range of the VCO. These numbers of pumps are not meant to be limiting.

Each up or down charge pump of FIGS. 7B and 7C may represent a "Bang-Bang" (i.e., fully on, fully off) pump up charge pump (e.g., by pumping a positive electronic current to or through the capacitor) and/or pump down charge pump (e.g., by pumping a negative electronic current to or through the capacitor). According to embodiments, the magnitude of charge pumped by each secondary charge pump may be different than each other.

Also, the concepts described above can be applied using various up pump and down pump pump magnitudes. For example, as noted above, in some cases, the magnitude of medium may be 50 percent of, the magnitude of weak may be 20 percent of, and the magnitude of very weak may be 10 percent of the magnitude of strong. However, other percentages may be used as well. Further, according to embodiments, in some cases, the magnitude of medium may be in a range of between 40 and 60 percent of, the magnitude of weak may be in a range of between 10 and 30 percent of, and the magnitude of very weak may be in a range of between 5 and 15 percent of the magnitude of strong. These percentages are not meant to be limiting.

Also, the magnitude of charge pumped by each secondary charge pump (or for the strong pump, which the others are relative to in magnitude) may be predetermined based on the reference frequency, the value of the capacitor 625 (e.g., the effect that the specific charge pump has on the VCO, sometimes known as the KVCO), the frequency range of the VCO, start up time (e.g., a predetermined start up time limit to reach phase lock), and the number of up and/or down charge pumps. The magnitude of charge pumped by some or all the secondary charge pumps may be greater than that of the primary charge pumps so that the second feedback loop can complement the primary loop by charging the capacitor up or down faster that the primary loop to get the PLL closer to a lock between the reference and feedback signals (e.g., within the dead zone). Once the frequency difference between the reference signal and the feedback signal is within the dead zone, the second feedback loop (e.g., frequency detector 705; or detector 740 and logic 1002) may stop signaling the secondary charge pumps (e.g., while continuing to detect the frequency difference).

In some embodiments, the magnitude of the strong pump may be predetermined so that pumping up only once with only Iup_strong (e.g., for one assertion of signal 751, processing of block 981, and/or processing of block 1151) charges capacitor 625 from zero volts (or no charge across the capacitor) to a sufficient voltage (e.g., charge) to cause the VCO to output signal 650 with a frequency sufficient to cause the frequency difference of signal 640 minus 645 to be within or above the Dead Zone with no further pumping. In other embodiments, the magnitude of the strong pump may be predetermined so that pumping up only twice or three times with only Iup_strong to cause the frequency difference of signal 640 minus 645 to be within or above the Dead Zone with no further pumping.

FIG. 12 illustrates a timing diagram 1200 of one embodiment of one half of a range controller type frequency detector 705 and/or 740. Specifically, FIGS. 12-13, without threshold counts 1207, 1307, 1327 or advanced signal 1021 (and 1016) may apply to frequency detector 705; while FIGS. 12-13, with threshold counts 1207, 1307, 1327 and advanced signal 1021 (and 1016) may apply to frequency detector 740. (Refer to the description of FIGS. 9-11 for a more detailed discussion of "one half" of a range controller type frequency detector.) In one embodiment, the frequency detector 705 and/or 740 includes a counter configured to count the transition edges of an associated signal. Depending on the frequency of the signal, the counter may take a time Tx to advance from a zero count 1205 to a full count 1215; a time t1 to advance from a zero count 1205 to inhibit count 1210; and a time tA to advance from a zero count 1205 to advanced count 1207. In some cases, at full count 1215, the counter sends a full count or end signal such as up signal 1015 or down signal 1020 sent to logic 1002.

Moreover, in some cases, at full count 1215, the counter sends a reset signal such as reset signal 1080 to the other counter of the range finder. Also, in some cases, at inhibit count 1210, the counter sends an inhibit signal such as inhibit signal 1082 to the other counter of the range finder. In some cases, at advanced count 1215, the counter sends an advanced signal such as advanced signal 1016 or advanced signal 1020 sent to logic 1002.

In one embodiment, either the up output or the down output of the frequency detector 705 is inhibited if a threshold count 1210 defined by the time t1 is asserted by the other half of the detector. In some embodiments, either the up output or the down current of the charge pump 720 is weak or very weak (e.g., a weaker or slower rate charging capacitor 625) if advanced count 1207 defined by the time tA is asserted by the other half of the detector. The time to reach a full count 1215 from the threshold count 1210 is defined by t2. Details with respect to setting the threshold count 1210 are described with reference to FIGS. 9-11 and 13A-C.

The count for inhibit count 1210 (e.g., as related to the count for full count 1215) may be predetermined based on or depending on a number of factors including: start up time, SCP current, the difference current magnitudes for the different regions, the capacitance of capacitor 625, and/or the frequency of signal 640. Other factors include using a smaller the dead zone so that the PLL (e.g., the difference between the frequencies of signals 645 and 640) is close enough to a required locked frequency when the SCP stops pumping that the primary CP can lock within a desired and/or predetermined amount of time.

The count for advanced count 1207 (e.g., as related to the count for full count 1215) may be predetermined based or depending on a number of factors including: counter resolution in the range controller (e.g., number of bits of the counter, such as, number of bits as compared to the frequency of the reference signal), and/or staying within a predetermined range of the dead zone. In some cases, the count for advanced count 1207 is determined by the specific implementation of the PLL, or can be arbitrary.

Advanced count 1207 (e.g., resulting in signal 1016 or 1021) may be a high strobe, which comes on at an advanced stage in the counter's count. By advanced it could be predetermined at half way or three quarters way to the end of full count 1215. According to embodiments, advanced count 1207 happens before or at the same time (e.g., count) as the inhibit count 1210. If the advanced signal is high from the slower counter, then a lesser strength pump is selected by the faster counter. These examples of advanced counts are not meant to be limiting as other counts may be used.

In one embodiment, the total time Tx to reach a full count 1215 is defined by the frequency of the measured signal and the number of bits the counter uses to count. In general, the total number of transition edges that a counter may count is defined by $2^n$, where n represents the number of bits the counter uses to count the transition edges. Thus, a three bit counter may count up to $2^3$ transitions or eight total transitions. For example, the total time Tx to count eight transitions may be a function of the frequency of the signal. These examples of full counts are not meant to be limiting as other counts may be used.

The counter may be selected to provide an optimum balance of resolution and responsiveness for the frequency of the signal. For example, the time Tx to complete a full count of eight for a high frequency signal may be short, nevertheless, the threshold count 1210 and 1207 may be determined for one of only 8 bit states. Therefore, the resolution is compromised for responsiveness. In general, a three bit counter may balance these tradeoffs adequately for typical computing frequencies.

Figure 13A:
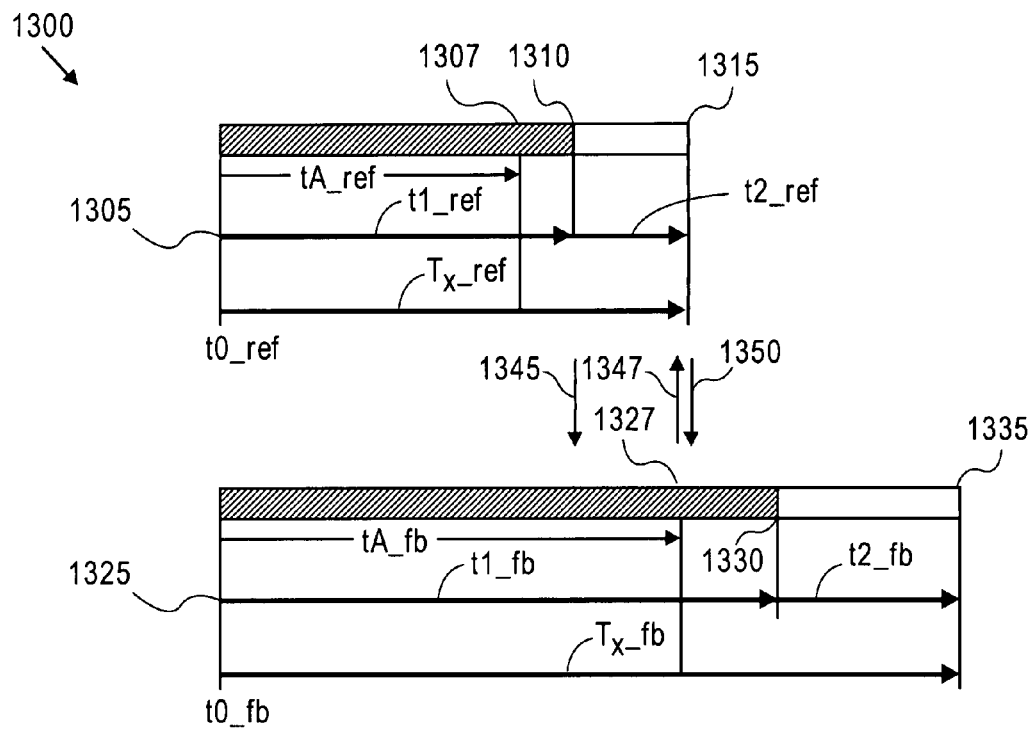
FIG. 13A illustrates a timing diagram of one embodiment of a symmetrical range controller response in which a frequency of a feedback signal is outside of a first predetermined range but within a second predetermined range of a reference frequency.

FIG. 13A illustrates a timing diagram of one embodiment of the response 1300 of a symmetrical range controller 1000 and/or 1001, where a frequency of a feedback signal 645 is outside of the dead zone 825 of the reference signal 640. Descriptions herein for counters, zero counts/time, threshold counts/time, advanced counts/time, full counts/time, inhibit counts/time, reset counts/time, transitions and advanced signals (e.g., for FIGS. 10-12) may apply to FIGS. 13A-C as well. For example, the frequency of feedback signal 645 is outside of a first predetermined range (e.g., the dead zone 825), but is within a second predetermined range (e.g., has a frequency difference less than maximum thresholds 842 and 837) of the frequency of reference signal 640.

In the depicted embodiment, the top timing diagram represents the timing of the first half frequency detector 1005/1006, which receives the reference signal 640. The bottom timing diagram represents the timing of the second half frequency detector 1010/1011, which receives the feedback signal 645.

At t0_ref 1305 and t0_fb 1325, the first half frequency detector 1005/1006 and the second half frequency detector 1010/1011 may be reset, each having a zero count at t0. If the frequency of the feedback signal 645 is lower than the frequency of the reference signal 640, the counter of the first half frequency detector may reach t1 before the counter of the second half frequency detector. At t1, the first half frequency detector asserts 1345 an inhibit signal to inhibit the output 1020 of the second half frequency detector. For example, signal 1345 may represent an inhibit signal similar to signal 1082 sent to the other counter of the range finder.

If the frequency of the feedback signal 645 is outside of the dead zone 825 of the frequency of the reference signal 640, the counter of the first half frequency detector may reach time t2 of full count 1315 before receiving an inhibit signal from the second half frequency detector 1010 (e.g., thus, the first half detector is thus outside the dead zone); and after the second half frequency detector asserts advanced signal 1347 to logic 1002 (e.g., thus, the first half detector is thus within the second range). For example, signal 1347 may represent an advanced signal similar to signal 1016 or 1021. The inhibit signal may have been to be asserted at t1 1330 and the advanced signal may have been asserted at time tA of advanced count 1327 of the second half frequency detector.

In such an embodiment, the first half frequency detector may assert the output signal 1350 and the second half frequency detector may have asserted the advanced signal 1347 to logic 1002. For example, signal 1350 may represent a full count or end signal such as up signal 1015 or down signal 1020 sent to logic 1002. Additionally, the first half frequency detector may send signal 1350 to the second half frequency detector to reset. For example, signal 1350 may also represent a reset or reset count signal such as reset signal 1080 sent to the other counter of the range finder. In such an embodiment, the counter in the second half frequency detector may reach advanced count tA (and thus may assert signal 1347 to logic 1002); but may not reach the count t1 (and therefore also not reach the full count at t2 1335) prior to the first half counter reaching full count t2.

Figure 13B:
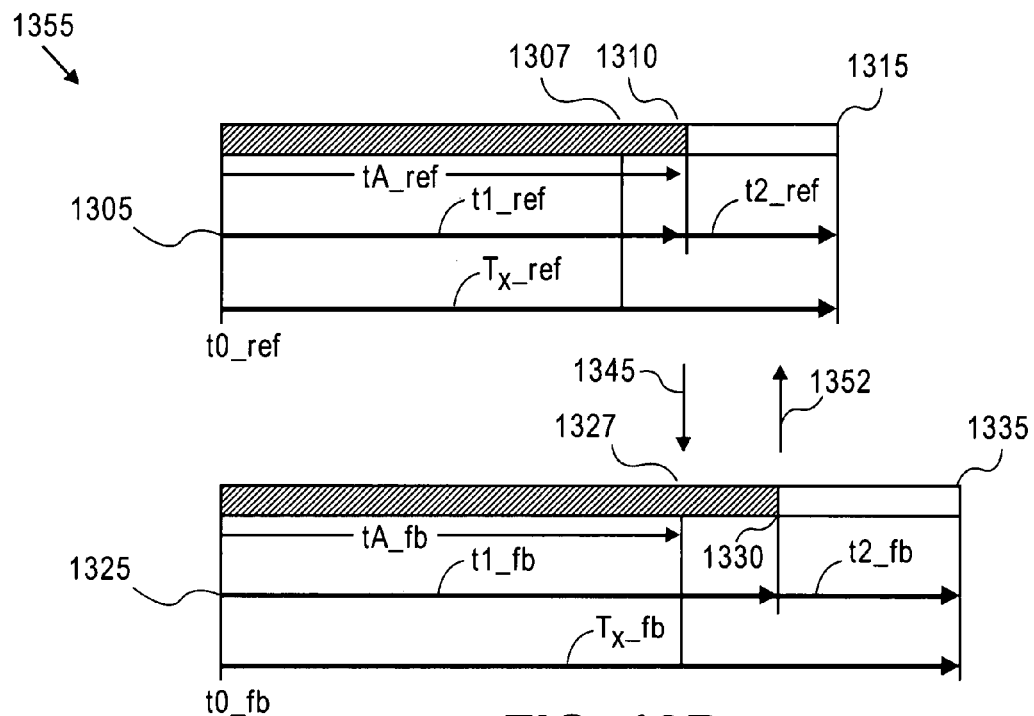
FIG. 13B illustrates a timing diagram of one embodiment of a symmetrical range controller response in which a frequency of a feedback signal is within a first predetermined range of a reference frequency.

FIG. 13B illustrates a timing diagram of one embodiment of the response 1355 of a symmetrical range controller 1000 and/or 1001, where a frequency of a feedback signal 645 is within a first predetermined range (e.g., dead zone 825) of the reference frequency 640. In one embodiment, both halves 1005/1006 and 1010/1011 of the frequency detector 705 start at a zero-count 1305 and 1325. In this depicted embodiment, the frequency of the feedback signal 645 may be lower than the frequency of the reference signal 640, but the frequency of the feedback signal 645 may lie within the dead zone 825.

Figure 13C:
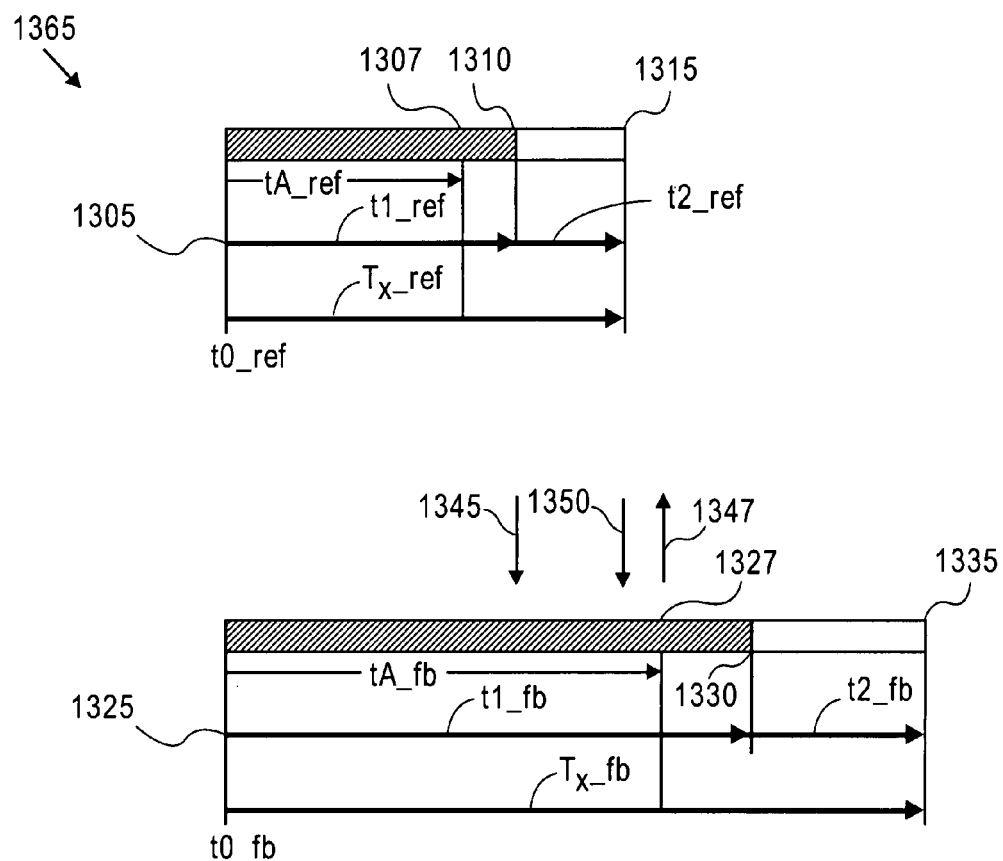
FIG. 13C illustrates a timing diagram of one embodiment of a symmetrical range controller response in which a frequency of a feedback signal is outside of a second predetermined range of a reference frequency.

At t1 1310, the first half frequency detector 1005 may inhibit 1345 the second half frequency detector 1010. Nevertheless, when the frequency is within the dead zone 825, the second half frequency detector 1010 may reach t1 1330 and inhibit 1352 the first half frequency detector 1005 before either half 1005/1006 and 1010/1011 reaches t2 1315 and 1335. For example, signal 1352 may represent an inhibit signal similar to signal 1345 and/or 1082 sent to the other counter of the range finder. In such an embodiment, neither half frequency detector generates an output signal 1015 and 1020, yet either half may reach t2 and reset the counterpart half. FIG. 13C illustrates a timing diagram of one embodiment of the response 1365 of a symmetrical range controller 1000 and/or 1001, where a frequency of a feedback signal 645 is outside of a first predetermined range (e.g., the dead zone 825), and/or is outside of a second predetermined range (e.g., has a frequency difference greater than maximum thresholds 842 and 837) of the frequency of reference signal 640.

At t0_ref 1305 and t0_fb 1325, the first half frequency detector 1005/1006 and the second half frequency detector 1010/1011 may be reset, each having a zero count at t0. If the frequency of the feedback signal 645 is lower than the frequency of the reference signal 640, the counter of the first half frequency detector may reach t1 before the counter of the second half frequency detector. At t1, the first half frequency detector asserts 1345 an inhibit signal to inhibit the output 1020 of the second half frequency detector.

If the frequency of the feedback signal 645 is outside of the dead zone 825 of the frequency of the reference signal 640, the counter of the first half frequency detector may reach t2 1315 before receiving an inhibit signal from the second half frequency detector (e.g., thus, the first half detector is thus outside the dead zone); and before the second half frequency detector asserts advanced signal 1347 (e.g., thus, the first half detector is thus outside the second range). The inhibit signal may have been to be asserted at t1 1330 and the advanced signal may have been to be asserted at time tA 1327 of the second half frequency detector. However, the first half detector sends full count 1350 to reset the second half, which causes the second half not to send or reach the advanced signal tA.

In such an embodiment, the first half frequency detector may assert the output signal 1015 and the second half frequency detector may not assert advanced signal 1347 to logic 1002. Additionally, the first half frequency detector may signal 1350 the second half frequency detector to reset. In such an embodiment, the counter in the second half frequency detector may not reach advanced count tA (and thus may not assert signal 1347 to logic 1002); and may not reach the count t1 (and therefore also not reach the full count at t2 1335) prior to the first half counter reaching full count t2.

It can be appreciated that the concepts above for FIGS. 10B-13C can be applied where the frequency of reference signal 640 is greater than that of feedback signal 645, such as to pump up the charge in capacitor 625 to adjust VCO 615 to increase the output frequency of output signal 650 until it is in or greater than a lower threshold of the dead zone (e.g., to increase the frequency of a feedback signal 645). Similarly, the concepts above for FIGS. 10B-13C can be applied where the frequency of feedback signal 645 is greater than that of reference signal 640, such as to pump down the charge in capacitor 625 to adjust VCO 615 to decrease the output frequency of output signal 650 until it is in or less than a lower threshold of the dead zone (e.g., to reduce the frequency of a feedback signal 645).

One embodiment of the frequency detector 1000 and/or 1001 may include logic to synchronize the reset the first and second halves of the frequency detector or range controller (e.g., to cause the first and second halves to begin counting or reset simultaneously), using techniques or circuitry as known in the art. Embodiments of the present invention, described herein, include a first control element that may initially use a very large current in the SCP to get the VCTRL node near to the desired voltage value for lock. Even if the voltage value overshoots on the initial charging, the first control element's subsequent current output of the SCP may reduce the current and allow quick settling to within the FD dead zone.

Consequently, advantages of such a circuit (e.g., first control element) include: operation of and quicker locking by the PLL at low reference clock frequencies; increased initial pump current by in the SCP to more quickly get closer to the desired VCTRL value; the first control element (e.g., frequency detector or range controller) may take itself out of the PLL loop (e.g., stop counting) to eliminate/prohibit overshoot/undershoot forever looping; decreased size of the dead zone in the FD, which keeps the first control element circuitry on for longer and allows the VCTRL to get closer to the desired value more quickly; initializing or using a reset signal to cause $P_{UP\_strong}$ to be ON from time 0 (the assumption is that reference signal 640 is faster than output 645), which may removes lead time for first $2^n$ refclk cycles of counting that are required to use the SCP without the reset; and using locked signal gates to cause the FD circuit to stop the counters and reduces power dissipation when PLL is in lock. Moreover, as compared to FD 705 and pump 710, use of FD 740 and pump 720 may decrease the overall time from start up or reset to phase lock (e.g., Lock Time) by 30%.

Embodiments of the present invention, described herein, include various operations. These operations may be performed by hardware components, software, firmware, circuitry, logic, or a combination thereof. Any of the signals provided over various lines or buses described herein may be time multiplexed with other signals and provided over one or more common lines or buses. Additionally, the interconnection between circuit components or blocks may be shown as buses or as single signal lines. Each of the lines or buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; electrical, optical, acoustical, or other form of propagated signal (e.g., carrier waves, infrared signals, digital signals, etc.); or another type of medium suitable for storing electronic instructions.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method, comprising:
   detecting, in a first feedback loop of a phase-locked loop circuit, a phase difference and a first frequency difference between a feedback signal from a voltage controlled oscillator and a reference signal;
   counting, in a second feedback loop of the phase-locked loop circuit operating in parallel with the first feedback loop, a frequency difference comprising a frequency of the reference signal minus a frequency of the feedback signal;
   adjusting the frequency of the feedback signal until the second frequency difference detected in the second feedback loop is within a first predetermined range, wherein adjusting the frequency comprises:
   signaling a first pump up charge pump in response to a determination the second frequency difference is above the first predetermined range and within the second predetermined range;
   signaling a first pump down charge pump in response to a determination the second frequency difference is below the first predetermined range and within the second predetermined range;
   signaling a second pump up charge pump in response to a determination the second frequency difference is above the second predetermined range; and
   signaling a second pump down charge pump in response to a determination the second frequency difference is below the second predetermined range;
   wherein the second pump up charge pump has a greater charge pump magnitude than the second pump down charge pump, the second pump down charge pump has a greater charge pump magnitude than the first pump up charge pump, and the first pump up charge pump has a greater charge pump magnitude than the first pump down charge pump; and
   tuning the phase and the frequency of the feedback signal until the phase and the frequency of the feedback signal is synchronized with the phase and the frequency of the reference signal.

2. The method of claim 1, further comprising:
   discontinuing counting when the phase and the frequency of the feedback signal is synchronized with the phase and the frequency of the reference signal.

3. The method of claim 2, further comprising:
   discontinuing adjusting when the second frequency difference detected in the second feedback loop is within the first predetermined range.

4. The method of claim 1, wherein adjusting comprises:
   reducing the second frequency difference detected in the second feedback loop at a first rate when the second frequency difference detected in the second feedback loop is outside the first predetermined range; and
   reducing the second frequency difference detected in the second feedback loop at a faster second rate when the second frequency difference detected in the second feedback loop is outside a second predetermined range, wherein the second predetermined range is greater in range than and overlaps the first predetermined range.

5. The method of claim 1, further comprising:
   signaling the second pump up charge pump, prior to counting, upon receipt by the PLL a power on signal or a reset signal.

6. A method, comprising:
   detecting a phase and a frequency of a first signal and a phase and a frequency of a second signal in a phase-locked loop circuit;
   adjusting the frequency of the second signal in a first control element based on the detected frequency of the first signal and the second signal until the frequency of the second signal is within a first predetermined range of the frequency of the first signal, wherein adjusting comprises:
   signaling a first pump up charge pump or a first pump down charge pump in response to a determination that the frequency of the second signal is outside of the first predetermined range; and
   signaling a second pump up charge pump or a second pump down charge pump in response to a determination that the frequency of the second signal is outside of a second predetermined range;
   wherein the second pump up charge pump has a greater charge pump magnitude than the second pump down charge pump, the second pump down charge pump has a greater charge pump magnitude than the first pump up charge pump, and the first pump up charge pump has a greater charge pump magnitude than the first pump down charge pump; and tuning the phase and the frequency of the second signal in a second control element based on the detected phase and frequency of the first signal and the second signal until the phase and the frequency of the second signal is synchronized with the phase and the frequency of the first signal, wherein said tuning in the second control element occurs in parallel with said adjusting in the first control element.

7. The method of claim 6, further comprising:
adjusting a voltage level of a capacitor in a control loop filter through the first control element; and
tuning a voltage level of a resistor and the capacitor in the control loop filter through the second control element.

8. The method of claim 6, wherein adjusting further comprises signaling a charge pump of a plurality of pump up charge pumps and a plurality of pump down charge pumps in the first control element in response to a determination that the frequency of the second signal is outside of the first predetermined range of the frequency of the first signal.

9. The method of claim 8, further comprising:
signaling a charge pump of the plurality of pump up charge pumps to increase a voltage at a capacitor node of a voltage controlled oscillator in response to a determination that the frequency of the first signal is higher than the frequency of the second signal;
signaling a charge pump of the plurality of pump down charge pumps to decrease the voltage at the capacitor node of the voltage controlled oscillator in response to a determination that the frequency of the first signal is lower frequency than the frequency of the second signal.

10. The method of claim 6, wherein the second pump up charge pump has a greater charge pump magnitude than the second pump down charge pump, the second pump down charge pump has a greater charge pump magnitude than the first pump up charge pump, and the first pump up charge pump has a greater charge pump magnitude than the first pump down charge pump, and
wherein adjusting further comprises:
signaling the first pump up charge pump in response to a determination that the frequency of the second signal is below the first predetermined range and within the second predetermined range,
signaling the first pump down charge pump in response to a determination that the frequency of the second signal is above the first predetermined range and within the second predetermined range,
signaling the second pump up charge pump in response to a determination that the frequency of the second signal is below the second predetermined range, and
signaling the second pump down charge pump in response to a determination that the frequency of the second signal is above the second predetermined range.

11. An apparatus, comprising:
a voltage controlled oscillator having a control node and a first signal line to output a first signal;
a control loop filter coupled to the control node, the control loop filter comprising a capacitor;
a first control element coupled to the capacitor of the control loop filter, coupled to the first signal line, and coupled to a second signal line to reference a second signal, the first control element to adjust a voltage across the capacitor based on a frequency difference between the first signal and the second signal, wherein the first control element comprises:

a plurality of pump up charge pumps and a plurality of pump down charge pumps coupled to the control loop filter; and
a frequency detector coupled to the charge pumps, the frequency detector configured to compare a frequency of the first signal to a frequency of the second signal, wherein the frequency detector comprises logic configured to:
signal a first pump up charge pump in response to a determination that the frequency of the second signal is below the first predetermined range and within a second predetermined range;
signal a first pump down charge pump in response to a determination that the frequency of the second signal is above the first predetermined range and within the second predetermined range;
signal a second pump up charge pump in response to a determination that the frequency of the second signal is below the second predetermined range; and
signal a second pump down charge pump in response to a determination that the frequency of the second signal is above the second predetermined range,
wherein the second pump up charge pump has a greater charge pump magnitude than the second pump down charge pump, the second pump down charge pump has a greater charge pump magnitude than the first pump up charge pump, and the first pump up charge pump has a greater charge pump magnitude than the first pump down charge pump; and
a second control element coupled to the control loop filter at the control node of the voltage controlled oscillator, coupled to the first signal line, and coupled to the second signal line to reference the second signal, the second control element to adjust a voltage across the capacitor based on a phase difference and a frequency difference between the first signal and the second signal, wherein the second control element is configured to operate in parallel with the first control element.

12. The apparatus of claim 11, wherein the control loop filter further comprises:
at least one resistor coupled to the control node of the first voltage controlled oscillator; and
wherein the capacitor is coupled between the at least one resistor and ground.

13. The apparatus of claim 12, wherein the
plurality of pump up charge pumps and the plurality of pump down charge pumps are coupled to a node between the at least one resistor and the capacitor of the control loop filter.

14. The apparatus of claim 13, wherein the first control element further comprises:
a phase locked signal input to receive a locked signal indicating that the phase difference and the frequency difference are zero;
logic gates to cause the first control element to discontinue adjusting the voltage based on receipt of the locked signal.

15. The apparatus of claim 13, wherein the frequency detector further comprises:
a range controller coupled to the charge pumps, the range controller configured to count the frequency difference between the first signal and the second signal and to signal the charge pumps in response to a determination the frequency of the second signal is outside of a predetermined range of the frequency of the first signal.

16. The apparatus of claim 15, wherein:

the first pump up and pump down charge pumps to reduce the frequency difference between the first signal and a second signal at a first rate while the frequency difference is outside the first predetermined range; and the second pump up and pump down charge pumps to reduce the frequency difference between the first signal and a second signal at a faster second rate while the frequency difference is outside a second predetermined range of the frequency of the first signal, wherein the second predetermined range is greater in range than and overlaps the first predetermined range.

17. The apparatus of claim 16, wherein the first control element further comprises:

a reset signal input to receive a reset signal;

logic gates to cause the first control element to signal the second pump up charge pump based on receiving the reset signal and prior to counting the frequency difference between the first signal and the second signal.

* * * * *